(12) United States Patent
Williamson et al.

(10) Patent No.: US 10,197,227 B2
(45) Date of Patent: Feb. 5, 2019

(54) QUANTUM DOT CONTAINING OPTICAL ELEMENT

(71) Applicant: SAMSUNG ELECTRONICS CO., LTD., Suwon-si (KR)

(72) Inventors: Ryan C. Williamson, Somerville, MA (US); Sridhar Sadasivan, Somerville, MA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 13/924,262

(22) Filed: Jun. 21, 2013

(65) Prior Publication Data

US 2013/0277643 A1    Oct. 24, 2013

Related U.S. Application Data

(63) Continuation of application No. PCT/US2011/066825, filed on Dec. 22, 2011.
(Continued)

(51) Int. Cl.
*H01L 27/15* (2006.01)
*F21K 9/64* (2016.01)
(Continued)

(52) U.S. Cl.
CPC .................. *F21K 9/64* (2016.08); *F21K 9/60* (2016.08); *F21K 9/62* (2016.08); *F21V 3/10* (2018.02);
(Continued)

(58) Field of Classification Search
CPC ..... H01L 27/156; H01L 27/153; H01L 33/50; F21V 29/505; F21V 29/506; F21V 3/0472; F21V 3/0481; F21V 29/70; F21V 29/002; F21V 29/004; F21V 13/08; F21V 7/04; F21V 7/041; F21V 13/10; F21V 7/22;
(Continued)

(56) References Cited

U.S. PATENT DOCUMENTS 5,442,254 A    8/1995    Jaskie
5,882,779 A    3/1999    Lawandy
(Continued)

FOREIGN PATENT DOCUMENTS

CN    1945099 A    *    4/2007
CN    101611500        12/2009
(Continued)

OTHER PUBLICATIONS

Written Opinion for PCT/US2011/066825 dated Apr. 24, 2012.*
(Continued)

*Primary Examiner* — Yu Chen
*Assistant Examiner* — Pauline Vu
(74) *Attorney, Agent, or Firm* — Cantor Colburn LLP

(57) ABSTRACT

An illumination device including a light source positioned at the distal end of a reflecting unit and a heat sink light transmissive substrate including quantum dots positioned at the proximal end of the reflecting unit with the reflecting unit having one or more reflecting side walls and a reflecting bottom wall and with the light source being separated a distance from the light transmissive substrate including quantum dots. In certain embodiments, the light source is an LED.

22 Claims, 9 Drawing Sheets

Related U.S. Application Data

(60) Provisional application No. 61/426,646, filed on Dec. 23, 2010.

(51) Int. Cl.

| | | |
|---|---|---|
| *F21K 9/62* | (2016.01) | |
| *H01L 33/50* | (2010.01) | |
| *F21V 13/08* | (2006.01) | |
| *F21V 29/506* | (2015.01) | |
| *F21K 9/60* | (2016.01) | |
| *F21V 3/10* | (2018.01) | |
| *F21V 29/00* | (2015.01) | |
| *F21V 7/04* | (2006.01) | |
| *F21V 9/00* | (2018.01) | |
| *F21V 29/505* | (2015.01) | |
| *F21V 29/70* | (2015.01) | |
| *F21V 7/22* | (2018.01) | |
| *F21Y 115/10* | (2016.01) | |
| *F21Y 107/00* | (2016.01) | |

(52) U.S. Cl.
CPC ............ *F21V 13/08* (2013.01); *F21V 29/506* (2015.01); *H01L 27/156* (2013.01); *H01L 33/50* (2013.01); *F21V 7/041* (2013.01); *F21V 7/22* (2013.01); *F21V 9/00* (2013.01); *F21V 29/004* (2013.01); *F21V 29/505* (2015.01); *F21V 29/70* (2015.01); *F21Y 2107/00* (2016.08); *F21Y 2115/10* (2016.08)

(58) Field of Classification Search
CPC ..... F21K 9/56; F21K 9/60; F21K 9/64; F21K 9/62; F21Y 2107/00; F21Y 2115/10
USPC .......................................................... 257/13
See application file for complete search history.

(56) References Cited

U.S. PATENT DOCUMENTS

| | | | |
|---|---|---|---|
| 6,069,440 A | 5/2000 | Shimizu et al. | |
| 6,357,889 B1 | 3/2002 | Duggal et al. | |
| 6,501,091 B1 | 12/2002 | Bawendi et al. | |
| 6,576,930 B2 | 6/2003 | Reeh et al. | |
| 6,600,175 B1 | 7/2003 | Baretz et al. | |
| 6,614,179 B1 | 9/2003 | Yoshinori et al. | |
| 6,641,755 B2 | 11/2003 | Tomoike et al. | |
| 6,734,465 B1 | 5/2004 | Taskar et al. | |
| 6,812,500 B2 | 11/2004 | Reeh et al. | |
| 6,864,626 B1 | 3/2005 | Weiss et al. | |
| 6,870,311 B2 | 3/2005 | Mueller et al. | |
| 7,144,131 B2 | 12/2006 | Rains | |
| 7,213,940 B1 | 5/2007 | Van De Ven et al. | |
| 7,279,832 B2 | 10/2007 | Thurk et al. | |
| 7,294,861 B2 | 11/2007 | Schardt et al. | |
| 7,374,807 B2 | 5/2008 | Parce et al. | |
| 7,481,562 B2 | 1/2009 | Chua et al. | |
| 7,494,246 B2 | 2/2009 | Harbers et al. | |
| 7,723,744 B2 | 5/2010 | Gillies et al. | |
| 7,819,539 B2 | 10/2010 | Kim et al. | |
| 8,017,972 B2 | 9/2011 | Lee et al. | |
| 8,159,131 B2 * | 4/2012 | Helbing ................ | H01L 33/507 313/512 |
| 8,168,994 B2 | 5/2012 | Cheon | |
| 8,294,156 B2 | 10/2012 | Jang et al. | |
| 8,835,199 B2 | 9/2014 | Kolodin et al. | |
| 2004/0116033 A1* | 6/2004 | Ouderkirk ............ | H01L 33/505 445/23 |
| 2004/0144987 A1* | 7/2004 | Ouderkirk ............ | H01L 33/44 257/98 |
| 2005/0012076 A1 | 1/2005 | Morioka | |
| 2005/0184638 A1* | 8/2005 | Mueller ............ | C09K 11/0883 313/485 |
| 2005/0200269 A1 | 9/2005 | Ng et al. | |
| 2005/0279915 A1* | 12/2005 | Elofson ................ | 250/205 |
| 2006/0034084 A1* | 2/2006 | Matsuura ............ | H01L 33/507 362/293 |
| 2006/0081862 A1 | 4/2006 | Chua et al. | |
| 2006/0103589 A1* | 5/2006 | Chua .................... | G02B 6/0023 345/3.1 |
| 2006/0113895 A1* | 6/2006 | Baroky ................ | B82Y 10/00 313/501 |
| 2006/0157686 A1 | 7/2006 | Jang et al. | |
| 2007/0131954 A1* | 6/2007 | Murayama et al. ........... | 257/98 |
| 2008/0054281 A1* | 3/2008 | Narendran ............ | H01L 33/507 257/98 |
| 2008/0054803 A1* | 3/2008 | Zheng ................ | H01L 33/50 313/506 |
| 2008/0105887 A1 | 5/2008 | Narendran et al. | |
| 2008/0106887 A1* | 5/2008 | Salsbury ................ | F21K 9/64 362/84 |
| 2008/0117500 A1* | 5/2008 | Narendran et al. ............ | 359/326 |
| 2008/0123339 A1* | 5/2008 | Bierhuizen et al. .......... | 362/293 |
| 2008/0173886 A1 | 7/2008 | Cheon et al. | |
| 2008/0231170 A1 | 9/2008 | Masato et al. | |
| 2008/0252198 A1 | 10/2008 | Katano et al. | |
| 2009/0001395 A1* | 1/2009 | Chung ................ | C09K 11/565 257/98 |
| 2009/0086492 A1* | 4/2009 | Meyer ............................ | 362/294 |
| 2009/0162011 A1 | 6/2009 | Coe-Sullivan et al. | |
| 2009/0201577 A1* | 8/2009 | Laplante ............ | G01N 21/6458 359/355 |
| 2009/0283785 A1 | 11/2009 | Kim | |
| 2009/0322197 A1 | 12/2009 | Helbing | |
| 2009/0322205 A1* | 12/2009 | Lowery ........................ | 313/493 |
| 2009/0322208 A1* | 12/2009 | Shaikevitch et al. ......... | 313/503 |
| 2010/0044729 A1 | 2/2010 | Naum et al. | |
| 2010/0051898 A1 | 3/2010 | Kim et al. | |
| 2010/0052512 A1 | 3/2010 | Clough et al. | |
| 2010/0060143 A1 | 3/2010 | Zimmerman et al. | |
| 2010/0067214 A1 | 3/2010 | Hoelen et al. | |
| 2010/0120182 A1* | 5/2010 | Kim ...................... | H01L 33/486 438/27 |
| 2010/0123155 A1* | 5/2010 | Pickett et al. ................... | 257/98 |
| 2010/0142183 A1* | 6/2010 | Lerenius ........................ | 362/85 |
| 2010/0149783 A1 | 6/2010 | Takenaka et al. | |
| 2010/0149814 A1 | 6/2010 | Zhai et al. | |
| 2010/0165599 A1* | 7/2010 | Allen .................... | F21V 7/0025 362/84 |
| 2010/0172122 A1* | 7/2010 | Ramer ................ | F21V 14/003 362/84 |
| 2010/0193806 A1* | 8/2010 | Byun ............................ | 257/88 |
| 2010/0265307 A1 | 10/2010 | Linton et al. | |
| 2010/0277059 A1* | 11/2010 | Rains, Jr. ................ | B82Y 30/00 313/502 |
| 2010/0283014 A1 | 11/2010 | Breen et al. | |
| 2010/0283036 A1* | 11/2010 | Coe-Sullivan ........ | H05B 33/145 257/13 |
| 2010/0308354 A1 | 12/2010 | David et al. | |
| 2011/0012141 A1* | 1/2011 | Le Toquin et al. .............. | 257/89 |
| 2011/0068356 A1* | 3/2011 | Chiang .................... | C23C 28/00 257/98 |
| 2011/0081538 A1 | 4/2011 | Linton | |
| 2011/0103064 A1 | 5/2011 | Coe-Sullivan et al. | |
| 2011/0121260 A1 | 5/2011 | Jang et al. | |
| 2011/0133654 A1 | 6/2011 | McKenzie et al. | |
| 2011/0140633 A1 | 6/2011 | Archenhold | |
| 2011/0156071 A1* | 6/2011 | Cheng .................... | H01L 33/44 257/98 |
| 2011/0182056 A1* | 7/2011 | Trottier ................ | H01L 33/507 362/84 |
| 2011/0186811 A1 | 8/2011 | Coe-Sullivan et al. | |
| 2011/0245533 A1 | 10/2011 | Breen et al. | |
| 2011/0303940 A1 | 12/2011 | Lee et al. | |
| 2012/0104437 A1* | 5/2012 | Weber ................ | H01L 33/502 257/98 |
| 2012/0187367 A1 | 7/2012 | Modi et al. | |
| 2012/0189791 A1 | 7/2012 | Modi et al. | |
| 2012/0195340 A1 | 8/2012 | Cheon et al. | |
| 2012/0205621 A1 | 8/2012 | Cheon et al. | |
| 2012/0248479 A1 | 10/2012 | Anc | |
| 2012/0256141 A1 | 10/2012 | Nick et al. | |

(56) References Cited

U.S. PATENT DOCUMENTS

| | | |
|---|---|---|
| 2012/0286238 A1 | 11/2012 | Linton et al. |
| 2012/0313075 A1 | 12/2012 | Linton et al. |
| 2013/0001597 A1 | 1/2013 | Anc et al. |
| 2013/0002124 A1 | 1/2013 | Izumi et al. |
| 2013/0099212 A1 | 4/2013 | Jang et al. |
| 2013/0100659 A1* | 4/2013 | Narendran ............... F21S 8/06 362/231 |
| 2013/0334559 A1 | 12/2013 | Vdovin et al. |
| 2014/0022779 A1 | 1/2014 | Su et al. |
| 2014/0061584 A1 | 3/2014 | Mahan et al. |
| 2014/0151736 A1 | 6/2014 | Narendran et al. |
| 2015/0016088 A1 | 1/2015 | Shiraichi et al. |

FOREIGN PATENT DOCUMENTS

| | | | |
|---|---|---|---|
| CN | 101806404 A | 8/2010 | |
| JP | H01260707 | 10/1989 | |
| JP | H09304623 | 11/1997 | |
| JP | 2007073206 | 3/2007 | |
| JP | 2007103099 | 4/2007 | |
| JP | 2007103513 | 4/2007 | |
| JP | 2009071005 | 4/2009 | |
| WO | WO 2010012999 A2 * | 2/2010 | ............... F21K 9/00 |
| WO | WO2011047385 A1 | 4/2011 | |
| WO | WO2012088404 A1 | 6/2012 | |
| WO | WO2012135744 A2 | 10/2012 | |
| WO | WO2012164283 A1 | 12/2012 | |
| WO | WO2012164284 A2 | 12/2012 | |

OTHER PUBLICATIONS

International Search Report for PCT/US2011/066825 dated Apr. 24, 2012.*

Ashdown, I., et al., "Six-color mixing and warm-white/green/blue offer new approaches to generating white LED light" *LEDs Magazine*, Oct. 2006, pp. 19-21.

Chinese Office Action (first) dated Jun. 2, 2015 in counterpart Chinese Patent Application No. 2011800681820, (Chinese).

Chinese Search Report dated May 22, 2015 in counterpart Chinese Patent Application No. 2011800681820.

Chinese Office Action (second) dated Apr. 25, 2016 in counterpart Chinese Patent Application No. 2011800681820, (Chinese).

Dabbousi, et al., "(CdSe) ZnS Core-Shell Quantum Dots: Synthesis and Characterization of a Size Series of Highly Luminescent Nanocrystallites", J. Phys. Chem. 101, 9463, 1997.

Extended European Search Report and Written Opinion dated Aug. 1, 2014 counterpart European Patent Application No. EP 11851484.

Communication under 71(3) dated Mar. 21, 2016 in counterpart European Patent Application No. EP 11851484.

Goetz, W., et al., "Development of Key Technologies for White Lighting Based on Light-Emitting diodes (LEDs)", Final Report issued Jun. 2004, Doe Award No. DE-FC26-01NT41251.

Jones-Bey, H., "Quantum-dot research targets general illumination", *Laser Focus World* (world wide web—laserfocusworld—dot—com), Mar. 2006.

Mannan, O., "Creating White Light Utilizing Remote Phosphor Technology", Future Electronics, FTM, Oct. 2011, p. 26-27.

Murray, C., "Synthesis and Characterization of II-VI Quantum Dots and Their Assembly into 3-D Quantum Dot Superlattices", Thesis, Massachusetts Institute of Technology, Sep. 1995.

Murray, C., et al., "Synthesis and Characterization of Nearly Monodisperse CdE (E = S, Se, Te) Semiconductor Nanocrystallites" (Nov. 1993), J. Am. Chem. Soc., 115, pp. 8706-8715.

Murray, C.B., et al., "Synthesis and Characterization of Monodisperse Nanocrystals and Close-Packed Nanocrystal Assemblies", Annu. Rev. Mater. Sci., 2000, 30: pp. 545-610.

PCT Search Report and Written Opinion dated Apr. 24, 2012 for parent International Application No. PCT/US2011/066825.

Philips, "Design-in guide Philips Fortimo Led Spotlight Module (SLM) System" Mar. 2011 brochure, www.philips.com/fortimo. 31 pages.

Philips, "LEDs in general lighting . . . with Fortimo now you can . . . Philips Fortimo LED DLM system—a LED breakthrough in energy efficiency and higher lumen packages." Apr. 2010 brochure, www.philips.com/fortimo. 4 pages.

Philips, "Philips Fortimo SLM Design guide. Draft version (Mar. 1, 2010)" 33 pages.

QD Vision, Inc., "Nexxus Lighting and QD Vision Unveil World's First Commercial Quantum Dot/LED Lamp Line", Press Release dated May 5, 2009.

Chinese Office Action for Chinese Patent Application No. 201180068182.0 dated Jan. 20, 2017.

* cited by examiner

QUANTUM DOT CONTAINING OPTICAL ELEMENT

This application is a continuation of International Application No. PCT/US2011/066825, filed 22 Dec. 2011, which was published in the English language as PCT Publication No. WO 2012/088404 on 28 Jun. 2012, which International Application claims priority to U.S. Application No. 61/426,646 filed 23 Dec. 2010. Each of the foregoing is hereby incorporated herein by reference in its entirety.

FIELD OF THE DISCLOSURE

Embodiments of the present disclosure relate to the generation of light using semiconductor nanocrystals, also referred to as quantum dots, and their use in structures for lighting applications.

BACKGROUND OF THE DISCLOSURE

Light emitting devices (LEDs) are common in many lighting applications. LEDs commonly use phosphors to generate white light. The quality, color and directionality of light produced by LEDs are often poor. Optical components including quantum dots can be combined with an LED to produce light of certain wavelengths.

Accordingly, one object of the present invention is to increase performance of solid state lighting devices including such optical components including quantum dots.

BRIEF SUMMARY OF THE DISCLOSURE

The following presents a simplified summary in order to provide a basic understanding of some aspects of the disclosure. This summary is not an extensive overview of the disclosure. It is not intended to identify key or critical elements of the disclosure or to delineate the scope of the disclosure. The following summary merely presents some concepts of the disclosure in a simplified form as a prelude to the more detailed description provided below.

Embodiments of the present disclosure are directed to the combination of an LED light source and semiconductor nanocrystals, referred to as quantum dots, to generate light. According to one aspect, the combination includes one or more LEDs, a reflecting unit and quantum dots. According to one aspect, the reflecting unit is positioned relative to the one or more LEDs and to direct light toward the quantum dots. In another aspect, the quantum dots are positioned a distance away from the one or more LEDs to receive the light generated by the one or more LEDs or light reflected from the reflecting unit. The quantum dots emit light of one or more certain wavelengths. Mixtures or combinations or ratios of quantum dots are used to achieve certain desired radiation output. Such quantum dots can emit red and green light of certain wavelength when exposed to a suitable stimulus.

Quantum dot formulations can also be included in, or otherwise form, physical structures. Quantum dot formulations can include, for example, monomers which can be polymerized into desired physical structures, such as films.

According to one aspect, the quantum dots are configured as part of an optical element which is positioned on or adjacent the reflecting unit a distance away from the one or more LEDs. According to one aspect of the invention, the optical element is one or more light transmissive substrates, such as a transparent pane. The quantum dots can be configured as part of the light transmissive substrate in any desired geometry or spatial orientation such as a single area, for example, a circle, square, or other shaped region, in the center of the light transmissive substrate or multiple areas positioned at various locations on the light transmissive substrate. The quantum dots can be within the light transmissive substrate itself, sandwiched between two light transmissive substrates or applied as a layer attached to the surface of the light transmissive substrate, such as with a laminate or film. Multiple layers of quantum dots can be used in combination with one or more light transmissive substrates. The light transmissive substrate can be planar. Alternatively, the light transmissive substrate can be convex or concave. Further, the light transmissive substrate can be a lens. The combination of the optical element and quantum dots is referred to herein as a quantum light optic. In this arrangement, light from the one or more LEDs is directed by the reflecting unit in a beam toward the quantum light optic. The quantum dots then absorb the light and correspondingly emit light of a certain wavelength. According to one aspect, heat generated by the emission of light from the one or more LEDs and/or the quantum dots can be dissipated by the light transmissive substrate.

According to certain embodiments, the reflecting unit includes one or more walls having a reflective surface which may have various geometries to produce a desired area of the beam emanating from the reflecting unit depending upon the particular desired lighting application. In one aspect, the quantum dots absorb the light from the one or more LEDs and emit light of one or more certain wavelengths. Certain light emitted by the quantum dots is emitted away from the reflecting unit. Certain other light emitted by the quantum dots is emitted toward the reflecting unit and is in turn reflected by the reflecting unit toward the quantum light optic.

According to an additional aspect of the present disclosure, the light transmissive substrate is attached either permanently or removably to the reflecting unit by a light transmissive substrate connector. The LED is positioned a distance away from the light transmissive substrate and is attached either permanently or removably to the reflecting unit. According to one embodiment, the light emitting portion of the LED is positioned adjacent an opening through the reflecting unit such that light emitted from the LED may be reflected, if needed, by the reflecting walls of the reflecting unit. The geometry of the reflecting walls of the reflecting unit is selected to achieve particular desired areas of light output, such as a narrow beam or a broad beam. In addition, filters, films, coatings and other optical elements can be included to provide output light of desired characteristics.

According to further aspects of the present disclosure, the reflecting unit includes a connector having structure to connect the reflecting unit to a base unit. The connector can be unitary, such as a one-piece molded article, or integral with the reflecting unit or separate from the reflecting unit and mates with a corresponding structure in the base unit. It is to be understood that the reflecting unit is preferably removably attached to the base unit so that the reflecting unit can be removed and replaced if needed.

According to certain aspects of the present disclosure, the LED is electrically connectable to a base unit. The electrical connection can be achieved by hardwiring or by male/female or other fitted connectors which allow the LED to be removably electrically connected to the base unit.

An additional aspect of the present disclosure is the feature of a heat sink or dissipater for the heat energy generated by the emission of light from either the LED or the quantum dots or both. According to this aspect, the light transmissive substrate has a geometry to act as a heat sink or dissipater to the extent that the light transmissive substrate includes surface area free of quantum dots. According to this aspect, the quantum dots generate heat where they are located relative to the light transmissive substrate and the area that is free of quantum dots transfers heat away from the quantum dots and to the surrounding environment which may include elements contacting the light transmissive substrate and/or the atmosphere. In this manner, the need for a separate heat sink structure contacting the light transmissive substrate is reduced or rendered unnecessary. According to certain aspects, the base unit is also a heat sink or dissipater of heat to the extent that heat generated by the LED or quantum dots is transferred through the reflecting unit and/or LED to the base unit and further to the surrounding environment. According to one aspect, the exterior of the reflecting unit facing the base unit may optionally include an insulating material or coating or be formed of an insulating material so that heat emitted from the base unit and contacting the exterior of the reflecting unit may be prevented from heating the reflecting unit.

BRIEF DESCRIPTION OF THE DRAWINGS

The foregoing and other features and advantages of the present disclosure will be more fully understood from the following detailed description of illustrative embodiments taken in conjunction with the accompanying drawings in which.

DETAILED DESCRIPTION OF THE DISCLOSURE

Embodiments of the present disclosure are directed to the use of a light transmissive substrate including semiconductor nanocrystals, known as quantum dots, in combination with a stimulating light and a reflecting unit to produce light of one or more wavelengths. The combination of the present disclosure is used in various lighting applications and is referred to herein as a quantum light optic module.

Figure 1:
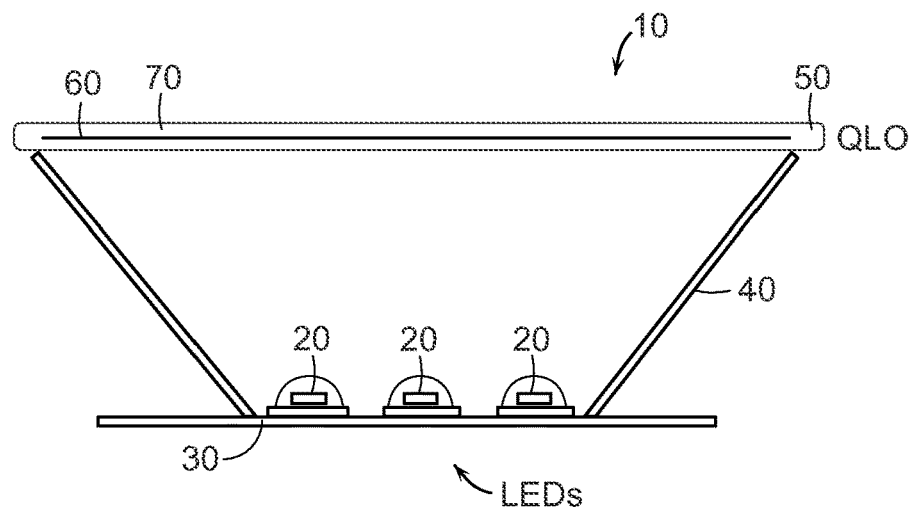
FIG. 1 is a schematic cross-section of a quantum light optic module of the present disclosure.

FIG. 1 depicts in schematic form the basic elements of a quantum light optic module 10 of the present disclosure. One or more LEDs 20, such as a plurality of LEDs, are positioned on, or as part of, a bottom wall or base 30 which is shown as being horizontal or planar. Surrounding the one or more LEDs 20 is a reflecting unit wall 40 shown as a conical structure. However, it is to be understood that reflecting unit wall 40 may be vertical or may be angled as desired A light transmissive substrate including quantum dots referred to herein as a quantum light optic 50 is positioned a distance away from the one or more LEDs and at the edge of the reflecting unit 40. A layer of quantum dots 60 is positioned within a light transmissive substrate 70. In this aspect, light is emitted from the LED toward the quantum light optic.

Figure 2:
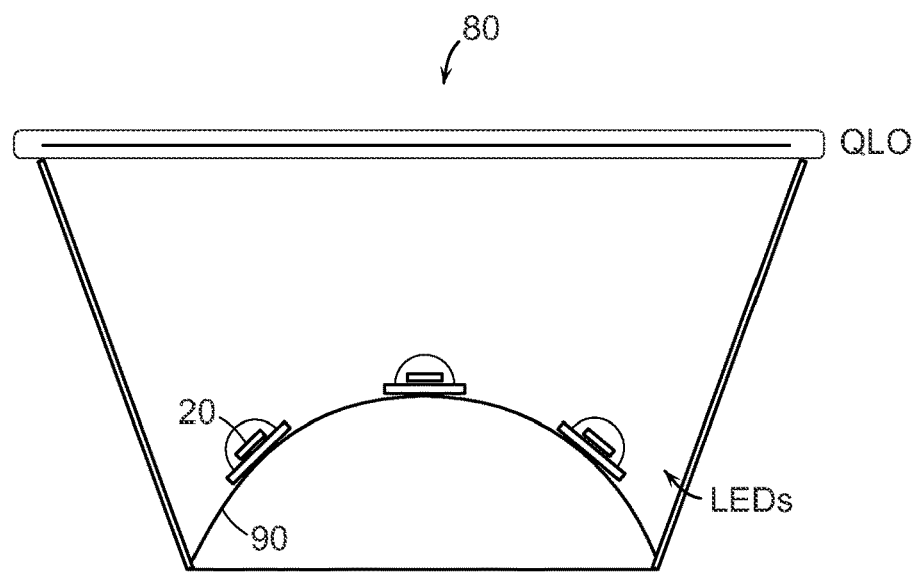
FIG. 2 is a schematic cross-section of a quantum light optic module of the present disclosure.

FIG. 2 depicts in schematic form a quantum light optic module 80 with the LEDs positioned on a curved bottom wall or curved base 90. The curved bottom wall or curved base 90 is shown as being convex relative to the interior of the quantum light optic module 80. It is to be understood that the curved bottom wall or curved base 90 may also be concave relative to the interior of the quantum light optic module 80 though not specifically shown. In general, although one embodiment within the scope of the present disclosure can have the LEDs positioned on a horizontal plane, the LEDs may also be positioned on a convex surface or a concave surface over which the reflecting unit may be placed. These embodiments provides for different spatial directions of light. For example, the LEDs positioned on a convex surface will provide for a greater spatial distribution of light while LEDs positioned on a concave surface will provide a more narrow spatial distribution of light.

Figure 3:
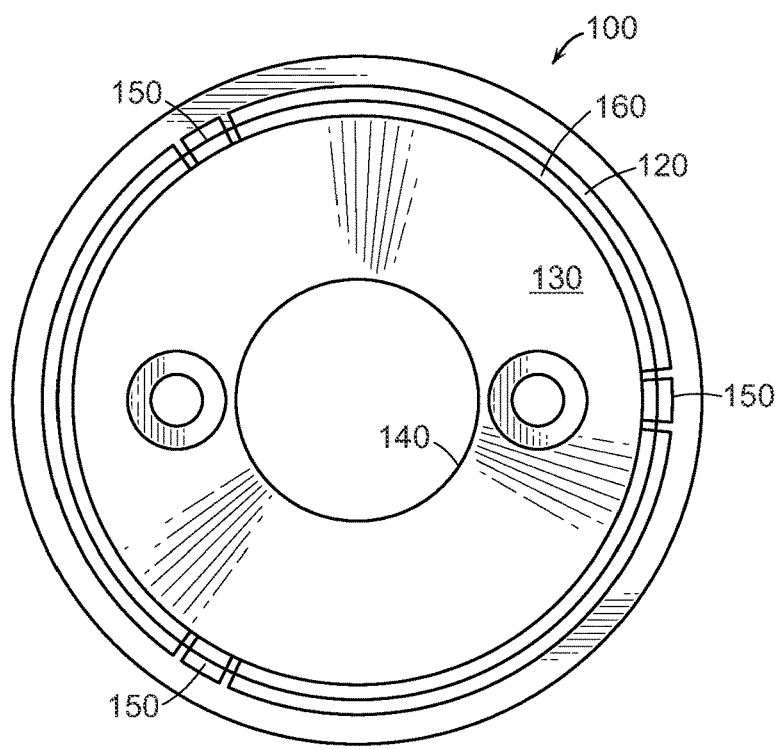
FIG. 3 is a top view of a reflecting unit of the present disclosure.

FIG. 3 is a top view of a reflecting unit according to the present disclosure. The reflecting unit is to be use in combination with a light source generally positioned at the base of the reflecting unit and quantum dots generally positioned a distance away from the light source. As can be seen, reflecting unit 100 includes at the distal output end an outer rim 120 and an opening defining an outer end of the reflecting unit 100 which is shown as being generally circular. Reflecting unit 100 further includes a wall with a reflective surface, i.e. a reflective wall, 130 shown as a parabolic or conical section that terminates at an opening 140 through the bottom section of reflecting unit 100 which is intended to receive a light source. However it is to be understood that the reflective wall 130 can be vertical, i.e. positioned at an angle of 0° relative to the light source positioned at opening 140. When the reflective wall is vertical, a bottom wall is provided which may or may not be reflective. In addition, reflective wall 130 can be positioned at an angle of between greater than 0° and less than 90° relative to the light source. According to some embodiments, reflective wall 130 forms a cone. According to additional embodiments, the reflective wall 130 is a parabolic reflective wall. According to this aspect, the reflecting unit 100 includes a convex or concave parabolic reflective wall. According to other aspects, reflective wall 130 can be continuous, substantially continuous, partially continuous or noncontinuous to the degree to which there may be one or more openings in the reflective wall.

A light transmissive substrate that includes quantum dots within the light transmissive substrate itself or adjacent the light transmissive substrate is to be preferably positioned at the outer rim 120 and an LED is to be positioned at the opening 140. The combination of the light transmissive substrate and the quantum dots is referred to as a quantum light optic. According to the present disclosure, the quantum light optic is separated a distance from the LED in the range of from about 0.25 inches about 4.0 inches, about 0.3 inches to about 3.5 inches, about 0.5 inches to about 3.0 inches, about 0.75 inches to about 2.5 inches, about 1.0 inches to about 2.0 inches, and any range or value in between whether overlapping or not. A medium, such as air, gas, silicone or a vacuum may be between the quantum light optic and the LED. The LED emits light directly toward the quantum light optic. To a certain degree, light emitted from the LED is directed by the reflecting unit toward the quantum light optic. Quantum dots absorb at least a portion of the light emitted by the LED and in turn emit isotropic light of certain wavelength. A portion of the light emitted by the quantum dots is directed past the output end of the reflecting unit and a portion of the light is back emitted away from the output end of the reflecting unit 100 toward the reflective wall 130, which in turn is reflected back through the quantum light optic and past the output end of the reflecting unit 100 as a beam of light for illumination generally in an arc of 180 degrees or less.

Positioned at the outer rim 120 are a plurality of quantum light optic connectors 150 shown as snap fit connectors and a planar edge 160 shown as being circular which is adjacent to the conical or parabolic reflective wall 130 and joining the circular outer rim 120. FIG. 3 depicts three individual quantum light optic connectors, however any number of individual quantum light optic connectors can be used such as 1, 2, 3, 4, 5, 6, 7, 8, and the like. It is to be understood that the plurality of individual quantum light optic connectors can be referred to herein as a quantum light optic connector insofar as the individual elements work together to secure the quantum light optic to the reflecting unit 100. The snap fit connectors 150 shown are biased and, as more clearly shown in FIG. 4, include an angled tab portion 170 having a tab lip 180. During assembly of a quantum light optic module of the present disclosure, a circular quantum light optic 190 having a diameter approximately equal to the diameter of the opening defined by the circular flat edge 160 is forced against the angled tab portion 170 which causes the angled tab portion 170 to bias backward away from the conical section 130. Once the quantum light optic moves past the angled tab portion 170, the snap fit connectors 150 bias or spring forward to approximately their original position and secure the quantum light optic against the circular flat edge 160 using the tab lip 180.

It is to be understood that alternate quantum light optic connector configurations are envisioned based on the present disclosure. For example, reflecting unit 100 may included a threaded section to engage a corresponding circular threaded connecting member that can be screwed to the outer rim 120 and thereby hold a quantum light optic in place. Still further, the quantum light optic can be placed against the reflecting unit 100 and then secured by a holder or other structure to apply pressure to the quantum light optic to secure it against the reflecting unit 100. Still further, the present disclosure contemplates screws, metal snaps, and adhesives, as well as, other connectors known to those of skill in the art, to fixedly engage the quantum light optic to the reflecting unit 100.

Figure 4:
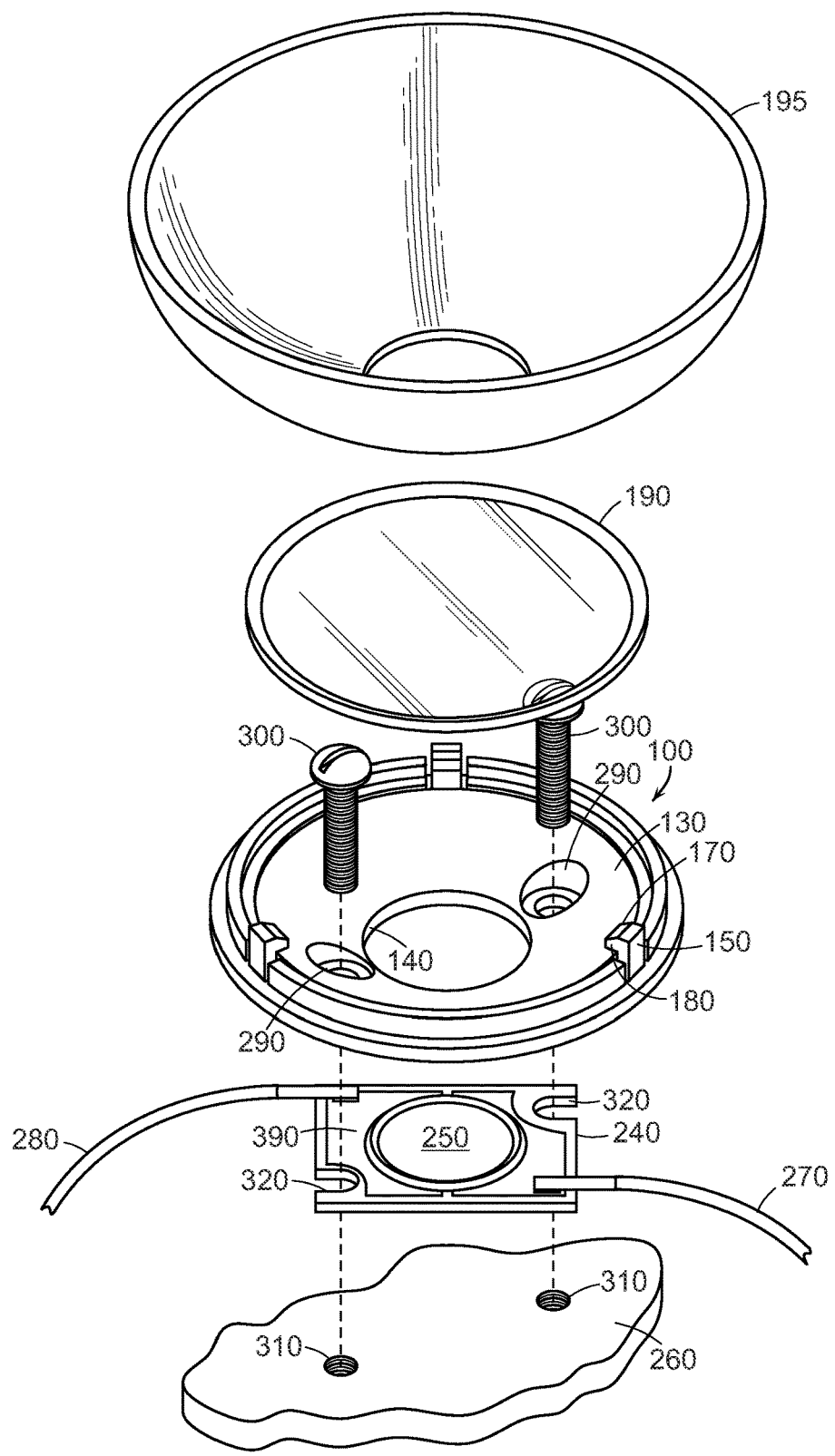
FIG. 4 is an exploded view of a combination of an LED, reflecting unit, and quantum light optic of the present disclosure.

Although the outer rim 120 is depicted as being circular, the outer rim 120 may be any suitable geometry such as oval, square, pentagon, hexagon, heptagon, octagon and the like and is generally determined by the desired reflective wall structure of the reflecting unit 100 and or the geometry of the quantum light optic. The circular geometry shown in FIG. 3 results from conical or parabolic reflective wall 130 of the reflecting unit 100 and a circular quantum light optic 190 as shown in FIG. 4. Conical or parabolic reflective wall 130 begins at circular flat edge portion 160 and then uniformly decreases in diameter approximating the shape of a cone or parabola until terminating at opening 140 through the bottom section of reflecting unit 100. It is to be understood that other wall geometries are envisioned by the present disclosure. For example, the wall may be cylindrical and perpendicular to a bottom wall portion or may be formed from intersecting vertical flat walls of various numbers such as 3, 4, 5, 6, 7, 8, or higher connecting to a bottom wall portion. According to certain aspects the bottom wall portion is continuous with side wall portions. According to certain aspects, the reflective wall may be curved, parabolic, Bezier spline walls and the like. The reflective walls generally form or interconnect along with a bottom reflective wall section to form an enclosed or partially enclosed area around one or more LEDs positioned at the bottom or distal section of the reflecting unit 100 and are used to reflect light toward the quantum light optic.

The reflective wall 130 is formed from or includes a layer or coating of a reflective material. Reflective material within the scope of the present disclosure include highly reflective plastic, aluminum, silver, 3M ESR reflective film, reflective dichroic coatings or films or the like or combinations or composites or dopants thereof or any other appropriate reflective material. The reflective material may be white or colored to facilitate color tuning of the quantum light optic. The reflective nature of the reflective wall 130 may be either specular or diffuse.

Figure 5:
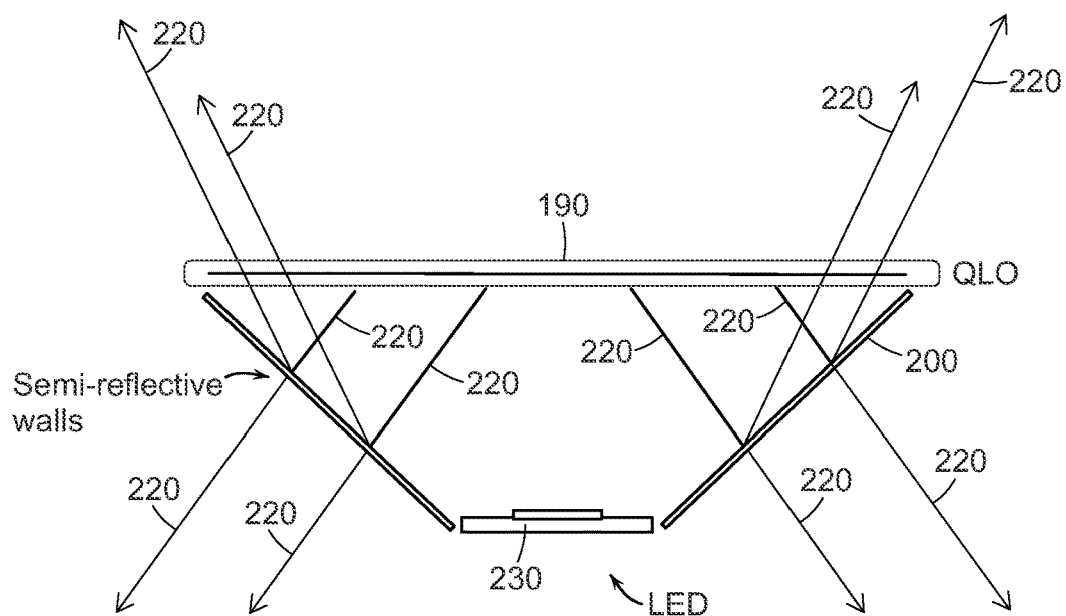
FIG. 5 is a schematic cross-section of a quantum light optic module of the present disclosure.

According to one aspect as shown in the schematic cross section of FIG. 5, the walls of the reflecting unit 200 include one or more openings or transparent sections or filter sections to allow light indicated by arrows 220 isotropically emitted from the quantum dots to pass through the reflecting unit 200 in a direction opposite the quantum light optic 190. An LED 230 emits light which is absorbed by the quantum dots which in turn isotropically emit light 220. Such an embodiment allows for the emission of light from the quantum light optic in an arc around the quantum light optic of greater than 180 degrees.

Figure 6:
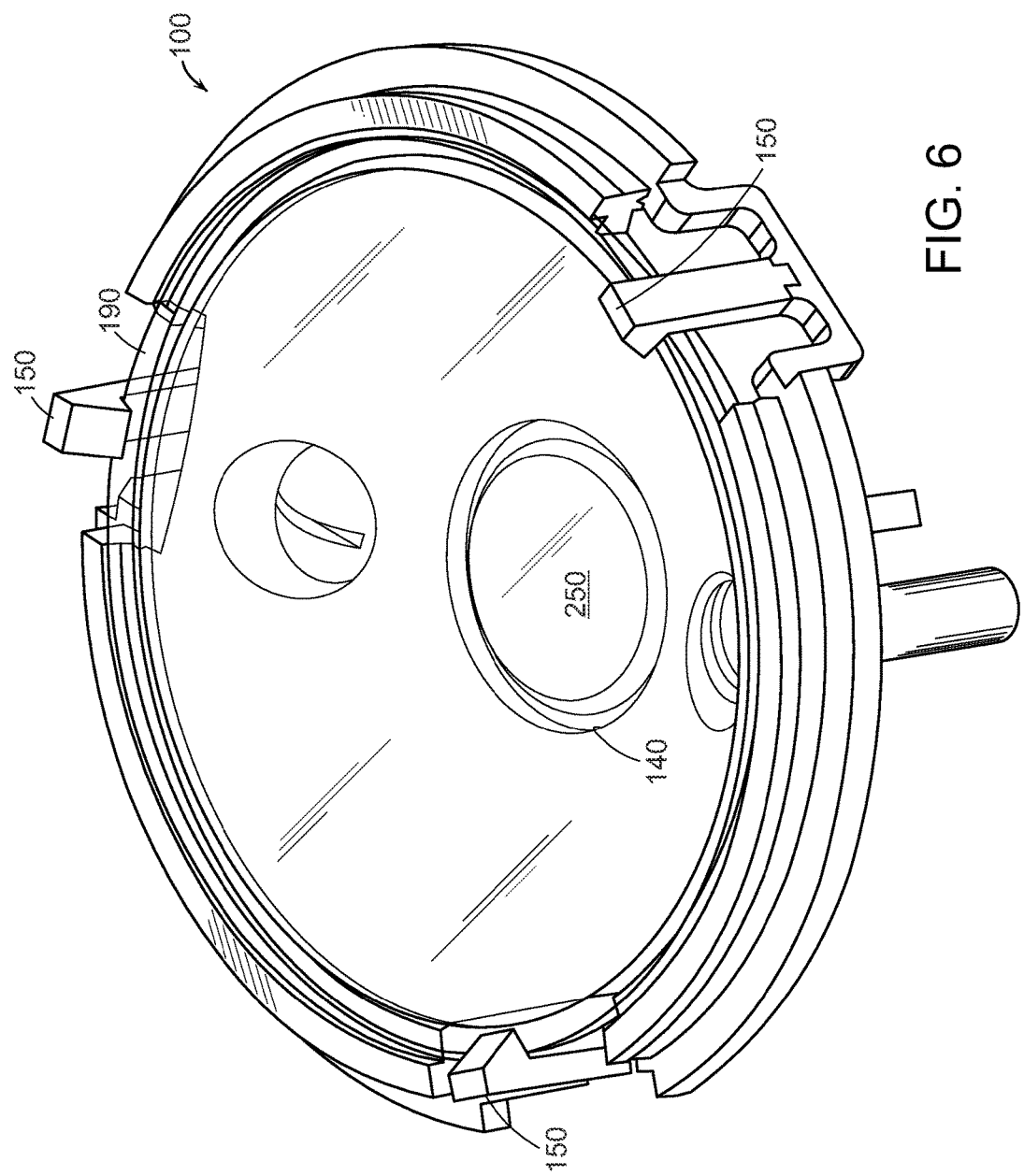
FIG. 6 is a perspective view of a reflecting unit showing a light transmissive substrate having quantum dots on the entire surface area of the light transmissive substrate and further showing light transmissive substrate connectors having a different configuration than shown in FIG. 3.

FIG. 6 is a perspective view of a quantum light optic 190 having a light transmissive substrate and quantum dots which is secured to a reflecting unit 100 by light transmissive substrate connectors 150. The light emitting portion 250 of an LED is shown positioned within the opening 140 at the bottom of the reflective wall 130. The light transmissive substrate includes quantum dots dispersed homogenously throughout the portion of the light transmissive substrate that resides above the conical reflective wall portion 130. The portion of the light transmissive substrate 190 that sits on the flat edge portion 160 lacks quantum dots since light from the LED does not directly impinge upon this section of the light transmissive substrate.

According to certain aspects, the reflective wall 130 of FIG. 3 or shown schematically in FIG. 1 as reflective wall 40 is designed to reach the etendue limit for narrow optics. According to one aspect, the quantum light optic of the present invention provides a narrow beam angle by using a particular reflective wall shape in combination with the light source in a manner to confine the emission to a relatively small initial emitting area. Such reflective wall shapes include a cone or parabola, which may be referred to as a paraboloid, insofar as a two dimensional parabola is rotated 360 degrees about its axis of symmetry to define a three-dimensional wall shape. Based on the wall design of the reflective section, the reflected light will be directed in a beam of certain area toward the quantum light optic. The wall design will also determine the distance of the quantum light optic from the LED. Altering the distance of the quantum light optic from the LED will create different light beam characteristics. For example, embodiments of the present disclosure are directed to the design and use of the reflective wall to change the emission pattern from the LED. According to this aspect, the reflective wall alters the emission pattern of the LED to match the emission profile of the quantum light optic to produce a uniform color across the final combined beam.

FIG. 4 is an exploded view of a combination of an LED 240, reflecting unit 100, quantum light optic 190 and a collimator 195 which directs the light emitted from the quantum dots in a desired direction. Collimator 195 has an opening to receive light from the quantum light optic. The diameter of the opening may be the same as or substantially equal to the diameter of the quantum light optic or the diameter of the opening may be less than the diameter of the quantum light optic. As shown in FIG. 4, the diameter of the opening of the collimator is smaller than the diameter of the quantum light optic. In addition, the diameter of the opening of the collimator is about equal to the diameter of the opening 140 of the reflecting unit 100. In addition, a thermal interface layer or material may be provided between the surface of the quantum light optic 190 and the collimator 195 in order to increase the heat sink capabilities of the quantum light optic. The reflecting unit 100 depicted in FIG. 3 is designed to be used with a single LED 240 which is shown in FIG. 4. According to FIG. 4, the opening 140 is shown as a circular opening having a diameter equal to or substantially equal to the diameter of a circular light generating element 250 of an LED. In addition, the opening of the collimator 195 has a diameter equal to or substantially equal to the diameter of the circular light generating element 250 of an LED. The LED in turn is contacted with a base 260. The opening 140 is placed adjacent to and over the circular light generating element 250 of the LED so that the light generated from the LED will enter the reflecting unit 100. It is to be understood that opening 140 can be any desired shape such as oval, square etc. and that the function of opening 140 is to allow the light emitting portion of an LED to be exposed to the reflective wall 130. It is further to be understood that the reflecting unit 100 can be used with any number of LEDs depending upon the desired size and shape of the quantum light optic. For example, a plurality of LEDs can be placed on a base and a reflecting unit having a single opening large enough to encircle or otherwise allow all of the LEDs to emit light into the reflecting unit can be placed over the plurality of LEDs. Alternatively, a number of openings 140 can be present in the bottom section of the reflecting unit 100 with each opening 140 corresponding to a light generating element of an LED. Still alternatively, the reflecting unit can have fewer openings than the number of LEDs with one or more openings corresponding to two or more light generating elements of LEDs. According to this embodiment, a plurality of LED light generating elements are positioned to direct their light into the reflecting unit and toward a quantum light optic.

It is to be understood that the reflecting unit may not utilize an opening 140. Instead, the bottom portion may be unitary with the reflective wall forming a reflective bottom wall portion and the LED or LEDs may be placed directly on the bottom wall portion with electrical connectors to the LEDs positioned through the bottom wall portion and protruding outward for electrical connection. Still further, the LED or LEDs may be fashioned as integral pieces of the bottom wall portion with electrical connectors to the LEDs protruding outward for electrical connection.

LEDs within the scope of the present disclosure include any conventional LED such as those commercially available from Citizen, Nichia, Osram, Cree, or Lumileds. Useful light emitted from LEDs includes white light, off white light, blue light, green light and any other light emitted from an LED.

According to certain aspects of the present disclosure as shown in FIG. 4, the LED 240 is mounted to the base 260 and includes electrical leads 270 and 280. The electrical connection can be achieved by hardwiring or by male/female or other fitted connectors, such as push in wire connectors, which allow the LED to be removably electrically connected to the base. According to one aspect, the reflecting unit 100 contacts the LED 240 with the light emitting portion 250 of the LED being exposed to reflecting walls of the reflecting unit and provides pressure on the LED when the reflecting unit is connected to the base. According to one embodiment, the combination of the LED, reflecting unit and light transmissive substrate including quantum dots can be fixed together into a quantum light optic module that has an electrical connector and a module connector which can mate with corresponding locations on the base to electrically engage the LED and also secure the module to the base. It is to be understood that the quantum light optic module is removably attached to the base so that the quantum light optic module can be removed and replaced if needed.

FIG. 4 depicts one design useful as a connector for securing the reflecting unit 100 to the base unit 260. Openings 290 are shown on opposite sides of the opening 140. Openings 290 are of a sufficient diameter to receive screws 300 which mate with corresponding threaded sections 310 in the base 260 to secure the reflecting unit 100 and the LED 240 to the base. LED 240 has openings 320 through which screws 300 pass. According to one aspect, the connector, such as a screw, has a limited or certain torque that provide a desired pressure to the LED without providing excessive pressure on the LED. In addition, mechanical stops, crush ribs, divots or other structural features can be added to provide operator feedback during assembly to allow for the desired pressure to the LED without providing excessive pressure on the LED.

Alternative embodiments of connectors include those which are unitary or integral with the reflecting unit or separate from the reflecting unit and mate with a corresponding structure in the base and, if desired, to electrically connect to the base. One such example of a connector is one or more protrusions which engage into corresponding recesses in the base, such as is characteristic of male/female type connectors, such as snap fit or press fit connectors, clips, heat stakes, snap rings, pins, metal snaps and the like. Still alternatively, the reflecting unit can include screw threads which mate with corresponding screw threads in the base unit such as with a typical light bulb or the reflecting unit can include protrusions which fit into corresponding recesses in the base which further provides for the reflecting unit, and therefore the protrusions, to be twisted and secured into the base unit, such as commonly found with automobile headlight lamp bulbs. It is to be understood that the reflecting unit is removably attached to the base so that the reflecting unit can be removed and replaced if needed.

In one aspect, the connector or connectors that secure the reflecting unit 100 to the base unit also provide pressure to the one or more LEDs that contact the reflecting unit and the base, which according to some embodiments acts as a heat sink. The pressure provides a thermal interface between the reflecting unit 100, the one or more LEDs 240 and the base 260. According to this aspect, the connector provides pressure to the LED and accordingly to the heat sink that contacts the LED which is advantageous in removing heat generated by the LED through the heat sink.

Figure 7:
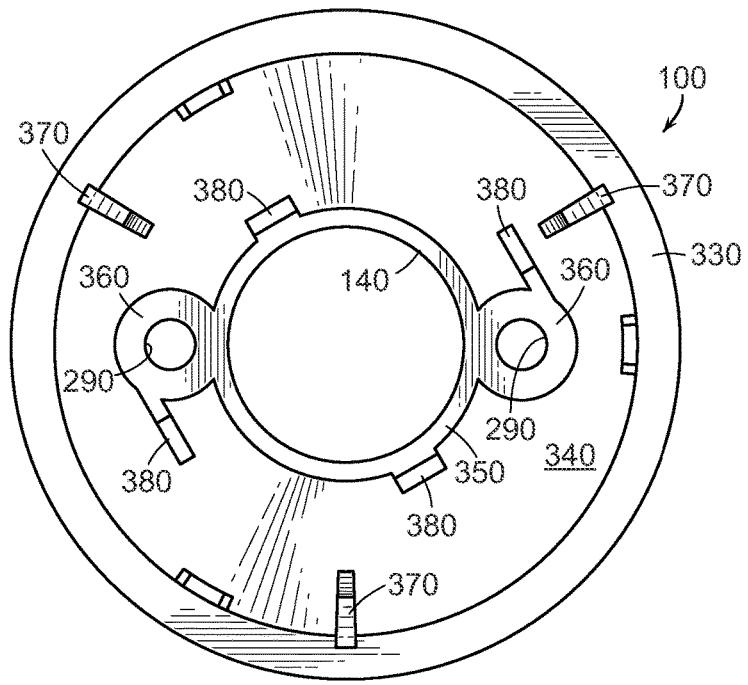
FIG. 7 is a bottom view of the reflecting unit of FIG. 3.

FIG. 7 is a bottom view of reflecting unit 100 which shows rim 330, outer wall 340 of the reflective wall 130 of FIG. 3, opening 140 at the bottom portion of the reflective wall 130 and the connector openings 290. The periphery of opening 140 includes horizontal surface 350. The periphery of openings 290 includes horizontal surfaces 360. According to one embodiment, the horizontal surface 360 is in the same plane as the horizontal surface 350. Outer wall 340 of the reflective wall 130 can be fashioned from a heat insulative material or can include a layer or coating of a heat insulative material. Such heat insulative materials include plastics, MCPET, PET, blown foams and the like. Such heat insulative materials are effective to inhibit heat from the base unit from entering into the reflecting unit through outer wall 340. In addition, the reflecting unit 100 can be fashioned from a heat transmissive and optically reflective coating, for example as a dichroic coating, such as is utilized in MR16 bulbs. With this embodiment, the heat, i.e. infrared radiation, is filtered out of the reflecting unit while the visible light is reflected by the reflecting unit.

As can be further seen in FIG. 7, reflecting unit 100 includes a plurality of legs 370 that extend from the upper portion of the outer wall 340 and the rim 330 and terminate in the same plane a distance from the opening 140. The legs 370 provide a stable base for the reflecting unit 100 and also elevate the outer wall 340 above the base to which it is to be attached. Reflecting unit 100 further includes a plurality of contacts 380 extending from the lower portion of the outer wall 340 and terminating in the same plane a distance from opening 140. In one embodiment of the present disclosure, the contacts 380 contact the base portion 390 of the LED as shown in FIG. 4.

According to certain aspects of the present disclosure, the reflecting unit 100 can be fabricated from various materials including metals, plastics, glass, ceramics and the like and composites thereof. Specific materials include polycarbonate, acrylics, enhanced or doped plastics, ABS, polyethylene or the like. It is to be understood that any material can be used in the manufacture of the reflecting unit per se, since a reflective coating can always be added to a reflecting unit. The reflecting unit can be made according to known methods such as injection molding, press molding blow molding, casting, forging, machining and the like.

According to additional aspects, quantum dots are nanometer sized particles that can have optical properties arising from quantum confinement. The particular composition(s), structure, and/or size of a quantum dot can be selected to achieve the desired wavelength of light to be emitted from the quantum dot upon stimulation with a particular excitation source. In essence, quantum dots may be tuned to emit light across the visible spectrum by changing their size. See C. B. Murray, C. R. Kagan, and M. G. Bawendi, *Annual Review of Material Sci.,* 2000, 30: 545-610 hereby incorporated by reference in its entirety.

Quantum dots can have an average particle size in a range from about 1 to about 1000 nanometers (nm), and preferably in a range from about 1 to about 100 nm. In certain embodiments, quantum dots have an average particle size in a range from about 1 to about 20 nm (e.g., such as about 5, 6, 7, 8, 9, 10, 11, 12, 13, 14, 15, 16, 17, 18, 19, or 20 nm). In certain embodiments, quantum dots have an average particle size in a range from about 1 to about 10 nm. Quantum dots can have an average diameter less than about 150 Angstroms (Å). In certain embodiments, quantum dots having an average diameter in a range from about 12 to about 150 Å can be particularly desirable. However, depending upon the composition, structure, and desired emission wavelength of the quantum dot, the average diameter may be outside of these ranges.

Preferably, a quantum dot comprises a semiconductor nanocrystal. In certain embodiments, a semiconductor nanocrystal has an average particle size in a range from about 1 to about 20 nm, and preferably from about 1 to about 10 nm. However, depending upon the composition, structure, and desired emission wavelength of the quantum dot, the average diameter may be outside of these ranges.

A quantum dot can comprise one or more semiconductor materials.

Examples of semiconductor materials that can be included in a quantum dot (including, e.g., semiconductor nanocrystal) include, but are not limited to, a Group IV element, a Group II-VI compound, a Group II-V compound, a Group III-VI compound, a Group III-V compound, a Group IV-VI compound, a Group compound, a Group II-IV-VI compound, a Group II-IV-V compound, an alloy including any of the foregoing, and/or a mixture including any of the foregoing, including ternary and quaternary mixtures or alloys. A non-limiting list of examples include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

In certain embodiments, quantum dots can comprise a core comprising one or more semiconductor materials and a shell comprising one or more semiconductor materials, wherein the shell is disposed over at least a portion, and preferably all, of the outer surface of the core. A quantum dot including a core and shell is also referred to as a "core/shell" structure.

For example, a quantum dot can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as quantum dot cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

A shell can be a semiconductor material having a composition that is the same as or different from the composition of the core. The shell can comprise an overcoat including one or more semiconductor materials on a surface of the core. Examples of semiconductor materials that can be included in a shell include, but are not limited to, a Group IV element, a Group II-VI compound, a Group II-V compound, a Group III-VI compound, a Group III-V compound, a Group IV-VI compound, a Group compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals.

In a core/shell quantum dot, the shell or overcoating may comprise one or more layers. The overcoating can comprise at least one semiconductor material which is the same as or different from the composition of the core. Preferably, the overcoating has a thickness from about one to about ten monolayers. An overcoating can also have a thickness greater than ten monolayers. In certain embodiments, more than one overcoating can be included on a core.

In certain embodiments, the surrounding "shell" material can have a band gap greater than the band gap of the core material. In certain other embodiments, the surrounding shell material can have a band gap less than the band gap of the core material.

In certain embodiments, the shell can be chosen so as to have an atomic spacing close to that of the "core" substrate. In certain other embodiments, the shell and core materials can have the same crystal structure.

Examples of quantum dot (e.g., semiconductor nanocrystal) (core)shell materials include, without limitation: red (e.g., (CdSe)CdZnS (core)shell), green (e.g., (CdZnSe) CdZnS (core)shell, etc.), and blue (e.g., (CdS)CdZnS (core) shell.

Quantum dots can have various shapes, including, but not limited to, sphere, rod, disk, other shapes, and mixtures of various shaped particles.

One example of a method of manufacturing a quantum dot (including, for example, but not limited to, a semiconductor nanocrystal) is a colloidal growth process. Colloidal growth occurs by injection an M donor and an X donor into a hot coordinating solvent. One example of a preferred method for preparing monodisperse quantum dots comprises pyrolysis of organometallic reagents, such as dimethyl cadmium, injected into a hot, coordinating solvent. This permits discrete nucleation and results in the controlled growth of macroscopic quantities of quantum dots. The injection produces a nucleus that can be grown in a controlled manner to form a quantum dot. The reaction mixture can be gently heated to grow and anneal the quantum dot. Both the average size and the size distribution of the quantum dots in a sample are dependent on the growth temperature. The growth temperature for maintaining steady growth increases with increasing average crystal size. Resulting quantum dots are members of a population of quantum dots. As a result of the discrete nucleation and controlled growth, the population of quantum dots that can be obtained has a narrow, monodisperse distribution of diameters. The monodisperse distribution of diameters can also be referred to as a size. Preferably, a monodisperse population of particles includes a population of particles wherein at least about 60% of the particles in the population fall within a specified particle size range. A population of monodisperse particles preferably deviate less than 15% rms (root-mean-square) in diameter and more preferably less than 10% rms and most preferably less than 5%.

An example of an overcoating process is described, for example, in U.S. Pat. No. 6,322,901. By adjusting the temperature of the reaction mixture during overcoating and monitoring the absorption spectrum of the core, overcoated materials having high emission quantum efficiencies and narrow size distributions can be obtained.

The narrow size distribution of the quantum dots (including, e.g., semiconductor nanocrystals) allows the possibility of light emission in narrow spectral widths. Monodisperse semiconductor nanocrystals have been described in detail in Murray et al. (J. Am. Chem. Soc., 115:8706 (1993)); in the thesis of Christopher Murray, and "Synthesis and Characterization of II-VI Quantum Dots and Their Assembly into 3-D Quantum Dot Superlattices", Massachusetts Institute of Technology, September, 1995. The foregoing are hereby incorporated herein by reference in their entireties.

The process of controlled growth and annealing of the quantum dots in the coordinating solvent that follows nucleation can also result in uniform surface derivatization and regular core structures. As the size distribution sharpens, the temperature can be raised to maintain steady growth. By adding more M donor or X donor, the growth period can be shortened. The M donor can be an inorganic compound, an organometallic compound, or elemental metal. For example, an M donor can comprise cadmium, zinc, magnesium, mercury, aluminum, gallium, indium or thallium, and the X donor can comprise a compound capable of reacting with the M donor to form a material with the general formula MX. The X donor can comprise a chalcogenide donor or a pnictide donor, such as a phosphine chalcogenide, a bis (silyl) chalcogenide, dioxygen, an ammonium salt, or a tris(silyl) pnictide. Suitable X donors include, for example, but are not limited to, dioxygen, bis(trimethylsilyl) selenide ($(TMS)_2Se$), trialkyl phosphine selenides such as (tri-noctylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl) telluride ($(TMS)_2Te$), bis(trimethylsilyl)sulfide ($(TMS)_2S$), a trialkyl phosphine sulfide such as (tri-noctyiphosphine) sulfide (TOPS), an ammonium salt such as an ammonium halide (e.g., $NH_4Cl$), tris(trimethylsilyl) phosphide ($(TMS)_3$ P), tris(trimethylsilyl) arsenide ($(TMS)_3As$), or tris(trimethylsilyl) antimonide ($(TMS)_3Sb$). In certain embodiments, the M donor and the X donor can be moieties within the same molecule.

A coordinating solvent can help control the growth of the quantum dot. A coordinating solvent is a compound having a donor lone pair that, for example, a lone electron pair available to coordinate to a surface of the growing quantum dot (including, e.g., a semiconductor nanocrystal). Solvent coordination can stabilize the growing quantum dot. Examples of coordinating solvents include alkyl phosphines, alkyl phosphine oxides, alkyl phosphoric acids, or alkyl phosphinic acids, however, other coordinating solvents, such as pyridines, furans, and amines may also be suitable for the quantum dot (e.g., semiconductor nanocrystal) production. Additional examples of suitable coordinating solvents include pyridine, tri-n-octyl phosphine (TOP), tri-n-octyl phosphine oxide (TOPO) and trishydroxylpropylphosphine (tHPP), tributylphosphine, tri (dodecyl)phosphine, dibutyl-phosphite, tributyl phosphite, trioctadecyl phosphite, trilauryl phosphite, tris(tridecyl) phosphite, triisodecyl phosphite, bis(2-ethylhexyl)phosphate, tris(tridecyl) phosphate, hexadecylamine, oleylamine, octadecylamine, bis(2-ethylhexyl)amine, octylamine, dioctylamine, trioctylamine, dodecylamine/laurylamine, didodecylamine tridodecylamine, hexadecylamine, diocta-decylamine, trioctadecylamine, phenylphosphonic acid, hexylphosphonic acid, tetradecylphosphonic acid, octyl-phosphonic acid, octadecylphosphonic acid, propylenediphosphonic acid, phenylphosphonic acid, aminohexylphosphonic acid, dioctyl ether, diphenyl ether, methyl myristate, octyl octanoate, and hexyl octanoate. In certain embodiments, technical grade TOPO can be used.

In certain embodiments, quantum dots can alternatively be prepared with use of non-coordinating solvent(s).

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of the quantum dots (including, e.g., semiconductor nanocrystals) can be further refined by size selective precipitation with a poor solvent for the quantum dots, such as methanol/butanol. For example, quantum dots can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected quantum dot (e.g., semiconductor nanocrystal) population preferably has no more than a 15% rms deviation from mean diameter, more preferably 10% rms deviation or less, and most preferably 5% rms deviation or less.

Semiconductor nanocrystals and other types of quantum dots preferably have ligands attached thereto.

Ligands can be derived from a coordinating solvent that may be included in the reaction mixture during the growth process.

Ligands can be added to the reaction mixture.

Ligands can be derived from a reagent or precursor included in the reaction mixture for synthesizing the quantum dots.

In certain embodiments, quantum dots can include more than one type of ligand attached to an outer surface.

A quantum dot surface that includes ligands derived from the growth process or otherwise can be modified by repeated exposure to an excess of a competing ligand group (including, e.g., but not limited to, coordinating group) to form an overlayer. For example, a dispersion of the capped quantum dots can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanoparticle, including, for example, but not limited to, phosphines, thiols, amines and phosphates.

For example, a quantum dot can be exposed to short chain polymers which exhibit an affinity for the surface and which terminate in a moiety having an affinity for a suspension or dispersion medium. Such affinity improves the stability of the suspension and discourages flocculation of the quantum dot. Examples of additional ligands include alkyl phosphines, alkyl phosphine oxides, alkyl phosphonic acids, or alkyl phosphinic acids, pyridines, furans, and amines. More specific examples include, but are not limited to, pyridine, tri-n-octyl phosphine (TOP), tri-n-octyl phosphine oxide (TOPO) and tris-hydroxylpropylphosphine (tHPP). Technical grade TOPO can be used.

Suitable coordinating ligands can be purchased commercially or prepared by ordinary synthetic organic techniques, for example, as described in J. March, Advanced Organic Chemistry, which is incorporated herein by reference in its entirety.

The emission from a quantum dot capable of emitting light can be a narrow Gaussian emission band that can be tuned through the complete wavelength range of the ultraviolet, visible, or infra-red regions of the spectrum by varying the size of the quantum dot, the composition of the quantum dot, or both. For example, a semiconductor nanocrystal comprising CdSe can be tuned in the visible region; a semiconductor nanocrystal comprising InAs can be tuned in the infra-red region. The narrow size distribution of a population of quantum dots capable of emitting light can result in emission of light in a narrow spectral range. The population can be monodisperse preferably exhibits less than a 15% rms (root-mean-square) deviation in diameter of such quantum dots, more preferably less than 10%, most preferably less than 5%. Spectral emissions in a narrow range of no greater than about 75 nm, preferably no greater than about 60 nm, more preferably no greater than about 40 nm, and most preferably no greater than about 30 nm full width at half max (FWHM) for such quantum dots that emit in the visible can be observed. IR-emitting quantum dots can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting quantum dot diameters decreases.

Quantum dots can have emission quantum efficiencies such as greater than 10%, 20%, 30%, 40%, 50%, 60%, 70%, 80%, or 90%.

The narrow FWHM of quantum dots can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of quantum dots will emit light spanning a narrow range of wavelengths.

Useful quantum dots according to the present disclosure are those that emit wavelengths characteristic of red light. In certain preferred embodiments, quantum dots capable of emitting red light emit light having a peak center wavelength in a range from about 615 nm to about 630 nm, and any wavelength in between whether overlapping or not. For example, the quantum dots can be capable or emitting red light having a peak center wavelength of about 630 nm, of about 625 nm, of about 620 nm, of about 615 nm.

Useful quantum dots according to the present invention are also those that emit wavelength characteristic of green light. In certain preferred embodiments, quantum dots capable of emitting green light emit light having a peak center wavelength in a range from about 520 nm to about 540 nm, and any wavelength in between whether overlapping or not. For example, the quantum dots can be capable or emitting green light having a peak center wavelength of about 520 nm, of about 525 nm, of about 535 nm, of about 540 nm.

According to further aspects of the present invention, the quantum dots exhibit a narrow emission profile in the range of between about 25 nm and about 60 nm at full width half maximum (FWHM). The narrow emission profile of quantum dots of the present disclosure allows the tuning of the quantum dots and mixtures of quantum dots to emit saturated colors thereby increasing color gamut and power efficiency beyond that of conventional LED lighting displays. According to one aspect, green quantum dots designed to emit a predominant wavelength of, for example, about 523 nm and having an emission profile with a FWHM of about, for example, 37 nm are combined, mixed or otherwise used in combination with red quantum dots designed to emit a predominant wavelength of about, for example, 617 nm and having an emission profile with a FWHM of about, for example 32 nm. Such combinations can be stimulated by blue light to create trichromatic white light.

Quantum dots in accordance with the present invention can be included in various formulations depending upon the desired utility. According to one aspect, quantum dots are included in flowable formulations or liquids to be included, for example, into clear vessels which are to be exposed to light. Such formulations can include various amounts of one or more type of quantum dots and one or more host materials. Such formulations can further include one or more scatterers. Other optional additives or ingredients can also be included in a formulation. In certain embodiments, a formulation can further include one or more photo initiators. One of skill in the art will readily recognize from the present disclosure that additional ingredients can be included depending upon the particular intended application for the quantum dots.

An optical material or formulation within the scope of the disclosure may include a host material, such as in the case of a quantum light optic, which may be present in an amount from about 50 weight percent and about 99.5 weight percent, and any weight percent in between whether overlapping or not. In certain embodiment, a host material may be present in an amount from about 80 to about 99.5 weight percent. Examples of specific useful host materials include, but are not limited to, polymers, monomers, resins, binders, glasses, metal oxides, and other nonpolymeric materials. Preferred host materials include polymeric and non-polymeric materials that are at least partially transparent, and preferably fully transparent, to preselected wavelengths of light. In certain embodiments, the preselected wavelengths can include wavelengths of light in the visible (e.g., 400-700 nm) region of the electromagnetic spectrum. Preferred host materials include cross-linked polymers and solvent-cast polymers. Examples of other preferred host materials include, but are not limited to, glass or a transparent resin. In particular, a resin such as a non-curable resin, heat-curable resin, or photocurable resin is suitably used from the viewpoint of processability. Specific examples of such a resin, in the form of either an oligomer or a polymer, include, but are not limited to, a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like. Other suitable host materials can be identified by persons of ordinary skill in the relevant art.

Host materials can also comprise silicone materials. Suitable host materials comprising silicone materials can be identified by persons of ordinary skill in the relevant art.

In certain embodiments and aspects of the inventions contemplated by this disclosure, a host material comprises a photocurable resin. A photocurable resin may be a preferred host material in certain embodiments, e.g., in embodiments in which the composition is to be patterned. As a photocurable resin, a photo-polymerizable resin such as an acrylic acid or methacrylic acid based resin containing a reactive vinyl group, a photo-crosslinkable resin which generally contains a photo-sensitizer, such as polyvinyl cinnamate, benzophenone, or the like may be used. A heat-curable resin may be used when the photo-sensitizer is not used. These resins may be used individually or in combination of two or more.

In certain embodiments and aspects of the inventions contemplated by this disclosure, a host material can comprise a solvent-cast resin. A polymer such as a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like can be dissolved in solvents known to those skilled in the art. Upon evaporation of the solvent, the resin forms a solid host material for the semiconductor nanoparticles.

In certain embodiments, acrylate monomers and/or acrylate oligomers which are commercially available from Radcure and Sartomer can be preferred.

Quantum dots can be encapsulated. Nonlimiting examples of encapsulation materials, related methods, and other information that may be useful are described in International Application No. PCT/US2009/01372 of Linton, filed 4 Mar. 2009 entitled "Particles Including Nanoparticles, Uses Thereof, And Methods" and U.S. Patent Application No. 61/240,932 of Nick et al., filed 9 Sep. 2009 entitled "Particles Including Nanoparticles, Uses Thereof, And Methods", each of the foregoing being hereby incorporated herein by reference in its entirety.

The total amount of quantum dots included in an optical material within the scope of the disclosure is preferably in a range from about 0.1 weight percent to about 10 weight percent, and any weight percent in between whether overlapping or not. The amount of quantum dots included in an optical material can vary within such range depending upon the application and the form in which the quantum dots are included (e.g., film, optics (e.g., capillary), encapsulated film, etc.), which can be chosen based on the particular end application. For instance, when an optic material is used in a thicker capillary with a longer pathlength (e.g., such as in BLUs for large screen television applications), the concentration of quantum dots can be closer to 0.5%. When an optical material is used in a thinner capillary with a shorter pathlength (e.g., such as in BLUs for mobile or hand-held applications), the concentration of quantum dots can be closer to 5%.

The ratio of quantum dots used in an optical material is determined by the emission peaks of the quantum dots used. For example, when quantum dots capable of emitting green light having a peak center wavelength in a range from about 520 nm to about 540 nm, and any wavelength in between whether overlapping or not, and quantum dots capable of emitting red light having a peak center wavelength in a range from about 615 nm to about 630 nm, and any wavelength in between whether overlapping or not, are used in an optical material, the ratio of the weight percent green-emitting quantum dots to the weight percent of red-emitting quantum dots can be in a range from about 9:1 to about 2:1, and any ratio in between whether overlapping or not.

The above ratio of weight percent green-emitting quantum dots to weight percent red-emitting quantum dots in an optical material can alternatively be presented as a molar ratio. For example, the above weight percent ratio of green to red quantum dots range can correspond to a green to red quantum dot molar ratio in a range from about 24.75 to 1 to about 5.5 to 1, and any ratio in between whether overlapping or not.

The ratio of the blue to green to red light output intensity in white trichromatic light emitted by a QD containing BLU described herein including blue-emitting solid state inorganic semiconductor light emitting devices (having blue light with a peak center wavelength in a range from about 450 nm to about 460 nm, and any wavelength in between whether overlapping or not), and an optical materials including mixtures of green-emitting quantum dots and red-emitting quantum dots within the above range of weight percent ratios can vary within the range. For example, the ratio of blue to green light output intensity therefor can be in a range from about 0.75 to about 4 and the ratio of green to red light output intensity therefor can be in a range from about 0.75 to about 2.0. In certain embodiments, for example, the ratio of blue to green light output intensity can be in a range from about 1.4 to about 2.5 and the ratio of green to red light output intensity can be in a range from about 0.9 to about 1.3.

Scatterers within the scope of the disclosure may be present, for example, in an amount of between about 0.01 weight percent and about 1 weight percent. Amounts of scatterers outside such range may also be useful. Examples of light scatterers (also referred to herein as scatterers or light scattering particles) that can be used in the embodiments and aspects of the inventions described herein, include, without limitation, metal or metal oxide particles, air bubbles, and glass and polymeric beads (solid or hollow). Other light scatterers can be readily identified by those of ordinary skill in the art. In certain embodiments, scatterers have a spherical shape. Preferred examples of scattering particles include, but are not limited to, $TiO_2$, $SiO_2$, $BaTiO_3$, $BaSO_4$, and ZnO. Particles of other materials that are non-reactive with the host material and that can increase the absorption pathlength of the excitation light in the host material can be used. In certain embodiments, light scatterers may have a high index of refraction (e.g., $TiO_2$, $BaSO_4$, etc) or a low index of refraction (gas bubbles).

Selection of the size and size distribution of the scatterers is readily determinable by those of ordinary skill in the art. The size and size distribution can be based upon the refractive index mismatch of the scattering particle and the host material in which the light scatterers are to be dispersed, and the preselected wavelength(s) to be scattered according to Rayleigh scattering theory. The surface of the scattering particle may further be treated to improve dispersability and stability in the host material. In one embodiment, the scattering particle comprises $TiO_2$ (R902+ from DuPont) of 0.2 µm particle size, in a concentration in a range from about 0.01 to about 1% by weight.

The amount of scatterers in a formulation is useful in applications where the ink is contained in a clear vessel having edges to limit losses due the total internal reflection. The amount of the scatterers may be altered relative to the amount of quantum dots used in the formulation. For example, when the amount of the scatter is increased, the amount of quantum dots may be decreased.

In certain embodiments, a formulation including quantum dots and a host material can be formed from an ink comprising quantum dots and a liquid vehicle, wherein the liquid vehicle comprises a composition including one or more functional groups that are capable of being cross-linked. The functional units can be cross-linked, for example, by UV treatment, thermal treatment, or another cross-linking technique readily ascertainable by a person of ordinary skill in a relevant art. In certain embodiments, the composition including one or more functional groups that are capable of being cross-linked can be the liquid vehicle itself. In certain embodiments, it can be a co-solvent. In certain embodiments, it can be a component of a mixture with the liquid vehicle.

One particular example of a preferred method of making an ink is as follows. A solution including quantum dots having the desired emission characteristics well dispersed in an organic solvent is concentrated to the consistency of a wax by first stripping off the solvent under nitrogen/vacuum until a quantum dot containing residue with the desired consistency is obtained. The desired resin monomer is then added under nitrogen conditions, until the desired monomer to quantum dot ratio is achieved. This mixture is then vortex mixed under oxygen free conditions until the quantum dots are well dispersed. The final components of the resin are then added to the quantum dot dispersion, and are then sonicated mixed to ensure a fine dispersion.

A film comprising an optical material prepared from such finished ink can be prepared by then coating the ink via a wide variety of methods onto the surface to be coated, and then UV cured under intense illumination for some number of seconds for a complete cure. Example of methods for preparing films include, but are not limited to, a variety of film casting, spin casting and coating techniques, which are well known. Examples of several coating techniques that can be utilized include, but are not limited to, screen printing, gravure, slot, curtain and bead coating.

Examples of thixotropes include, but are not limited to, fumed metal oxides (e.g., fumed silica which can be surface treated or untreated (such as Cab-O-Sil™ fumed silica products available from Cabot Corporation), fumed metal oxide gels (e.g., a silica gel). An optical material can include an amount of thixotrope in a range from about 2 to about 10 weight percent. Other amounts outside the range may also be determined to be useful or desirable.

In certain embodiments, for example, the ink can be cured with a Dymax 500EC UV Curing Flood system equipped with a mercury UVB bulb. In such case, a lamp intensity (measured as 33 mW/cm$^2$ at a distance of about 7" from the lamp housing) can be particularly effective, with the capillary being cured for 10-15 s and each side while being kept at a distance of 7" from the lamp housing. After curing, the edges of the capillary can be sealed.

In certain aspects and embodiments of the inventions taught herein, the optic including the cured quantum dot containing ink is exposed to light flux for a period of time sufficient to increase the photoluminescent efficiency of the optical material.

In certain embodiments, the optical material is exposed to light and heat for a period of time sufficient to increase the photoluminescent efficiency of the optical material.

In preferred certain embodiments, the exposure to light or light and heat is continued for a period of time until the photoluminescent efficiency reaches a substantially constant value.

In one embodiment, for example, after the optic is filled with quantum dot containing ink, cured, and sealed (regardless of the order in which the curing and sealing steps are conducted), the optic is exposed, to 25-35 mW/cm² light flux with a wavelength in a range from about 365 nm to about 470 nm, while at a temperature of in a range from about 25 to 80° C., for a period of time sufficient to increase the photoluminescent efficiency of the ink. In one embodiment, for example, the light has a wavelength of about 450 nm, the light flux is 30 mW/cm², the temperature 80° C., and the exposure time is 3 hours.

Quantum dots according to the present disclosure can also be included into various structures, for example, by being included as an ingredient during manufacture of the structure. Such structures include various light transmissive substrates or films for use in lighting devices. Other structures and devices include an optically transparent component including quantum dots dispersed or embedded therein, a film including quantum dots which is sandwiched between barrier materials and sealed therein such as to form a quantum light optic, or a film including quantum dots which is fully encapsulated by a barrier materials.

In certain preferred embodiments, a barrier material is optically transparent to at least light having predetermined wavelengths of light passing into and out of the optic. In certain embodiments, a barrier material is at least 90% optically transparent to at least predetermined wavelengths of light passing into and out of the optic. In certain embodiments, a barrier material is at least 95% optically transparent to at least predetermined wavelengths of light passing into and out of the optic. In certain embodiments, a barrier material is at least 99% optically transparent to at least predetermined wavelengths of light passing into and out of the optic.

In certain preferred embodiments, a barrier material will not yellow or discolor so as substantially alter the optical properties of the optic.

In certain preferred embodiments, a barrier material will not partially or fully delaminate during the useful lifetime of the optic.

In certain preferred embodiments, the properties of a barrier material will have minimal impact on the external quantum efficiency of an optical material.

In certain preferred embodiments, a barrier material can be formed under conditions that are not detrimental to an optical material and the external quantum efficiency of an optical material.

A barrier material is preferably a material that is substantially impervious to oxygen. In certain embodiments, a barrier layer is substantially impervious to oxygen and water. Inclusion of a barrier material over an optical material may be desirable in embodiments in which the optical material is not otherwise protected from environmental effects.

Example of suitable barrier films or coatings include, without limitation, a hard metal oxide coating, a thin glass layer, and Barix coating materials available from Vitex Systems, Inc. Other barrier films or coating can be readily ascertained by one of ordinary skill in the art.

Additional information that may be useful in connection with the present disclosure and the inventions described herein is included in International Application No, PCT/US2009/002796 of Coe-Sullivan et al, filed 6 May 2009, entitled "Optical Components, Systems Including An Optical Component, And Devices"; International Application No. PCT/US2009/002789 of Coe-Sullivan et al, filed 6 May 2009, entitled: "Solid State Lighting Devices Including Quantum Confined Semiconductor Nanoparticles, An Optical Component For A Solid State Light Device, And Methods"; International Application No. PCT/US2010/32859 of Modi et al, filed 28 Apr. 2010 entitled "Optical Materials, Optical Components, And Methods"; International Application No. PCT/US2010/032799 of Modi et al, filed 28 Apr. 2010 entitled "Optical Materials, Optical Components, Devices, And Methods"; International Application No. PCT/US2008/007901 of Linton et al, filed 25 Jun. 2008 entitled "Compositions And Methods Including Depositing Nanomaterial"; U.S. patent application Ser. No. 12/283,609 of Coe-Sullivan et al, filed 12 Sep. 2008 entitled "Compositions, Optical Component, System Including An Optical Component, Devices, And Other Products"; International Application No. PCT/US2008/10651 of Breen et al, filed 12 Sep. 2008 entitled "Functionalized Nanoparticles And Method"; International Application No. PCT/US2009/004345 of Breen et al, filed 28 Jul. 2009 entitled "Nanoparticle Including Multi-Functional Ligand And Method", U.S. Patent Application No. 61/234,179 of Linton et al. filed 14 Aug. 2009 entitled "Lighting Devices, An Optical Component For A Lighting Device, And Methods"; U.S. Patent Application No. 61/252,743 of Linton et al filed 19 Oct. 2009 entitled "An Optical Component, Products Including Same, And Methods For Making Same"; U.S. Patent Application No. 61/291,072 of Linton et al filed 30 Dec. 2009 entitled "An Optical Component, Products Including Same, And Methods For Making Same"; and International Application No. PCT/US2007/024320 of Clough et al, filed 21 Nov. 2007, entitled "Nanocrystals Including A Group IIIa Element And A Group Va Element, Method, Composition, Device And Other Products"; each of the foregoing being hereby incorporated herein by reference in its entirety.

In accordance with certain aspects of the present disclosure, quantum dots or quantum dot formulations can be included within a light transmissive substrate or they may be included within or on a layer or film to be attached to a light transmissive substrate. See PCT/US2010/045624 which is hereby incorporated by reference herein in its entirety for all purposes. Light transmissive substrates within the scope of the present disclosure are generally flat and may have any size or geometry such as circular, oblong, rectangle, square, pentagonal, hexagonal, heptagonal, octaganol, etc. In addition, the light transmissive substrates may be concave or convex. The thickness of the light transmissive substrate is within the range of thicknesses suitable for films, panes, lenses and the like. Light transmissive substrates may be fashioned from various transmissive or transparent materials including any optically clear material.

Figure 8:
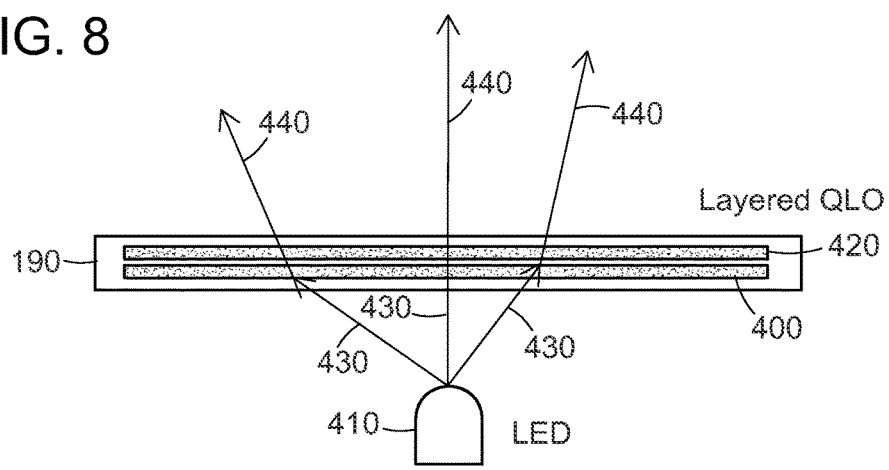
FIG. 8 depicts a light transmissive substrate with two layers of quantum dots.
Figure 9:
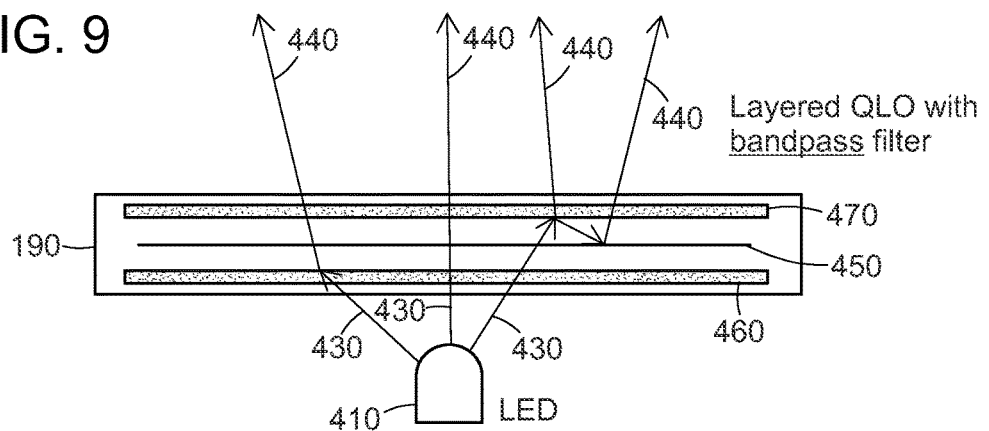
FIG. 9 depicts a light transmissive substrate with two layers of quantum dots with a bandpass filter between the two layers.

According to certain aspects, the light transmissive substrate can include a plurality of layers of quantum dots placed directly into the light transmissive substrate or through the use of films attached to the light transmissive substrate. For example, the light transmissive substrate can include 2 layers, 3, layers, 4 layers, 5 layers, 6 layers and more. Each layer can include a specific one or more types of quantum dots and arranged in a particular geometry. As shown in FIG. 8, in a quantum light optic 190, a first layer 400 disposed toward the LED 410 includes quantum dots of a first given type, such as red quantum dots. A second layer 420 disposed on top of the first layer and further away from the LED 410 includes quantum dots of a second given type, such as green quantum dots. Light 430 is emitted from the LED 410 With this layering, photons 440 emitted from the quantum dots which are converted from blue to red are not converted a second time by the layer including the green quantum dots since the green quantum dots will not absorb the red emission. An additional embodiment is depicted in FIG. 9. In FIG. 9, in a quantum light optic 190, a bandpass filter 450 is disposed between the layer of red quantum dots 460 and the layer of green quantum dots 470. The bandpass filter reflects back any isotropic quantum dot emission from the layer of green quantum dots directed toward the LED thereby preventing absorption by the layer of red quantum dots.

Figure 10:
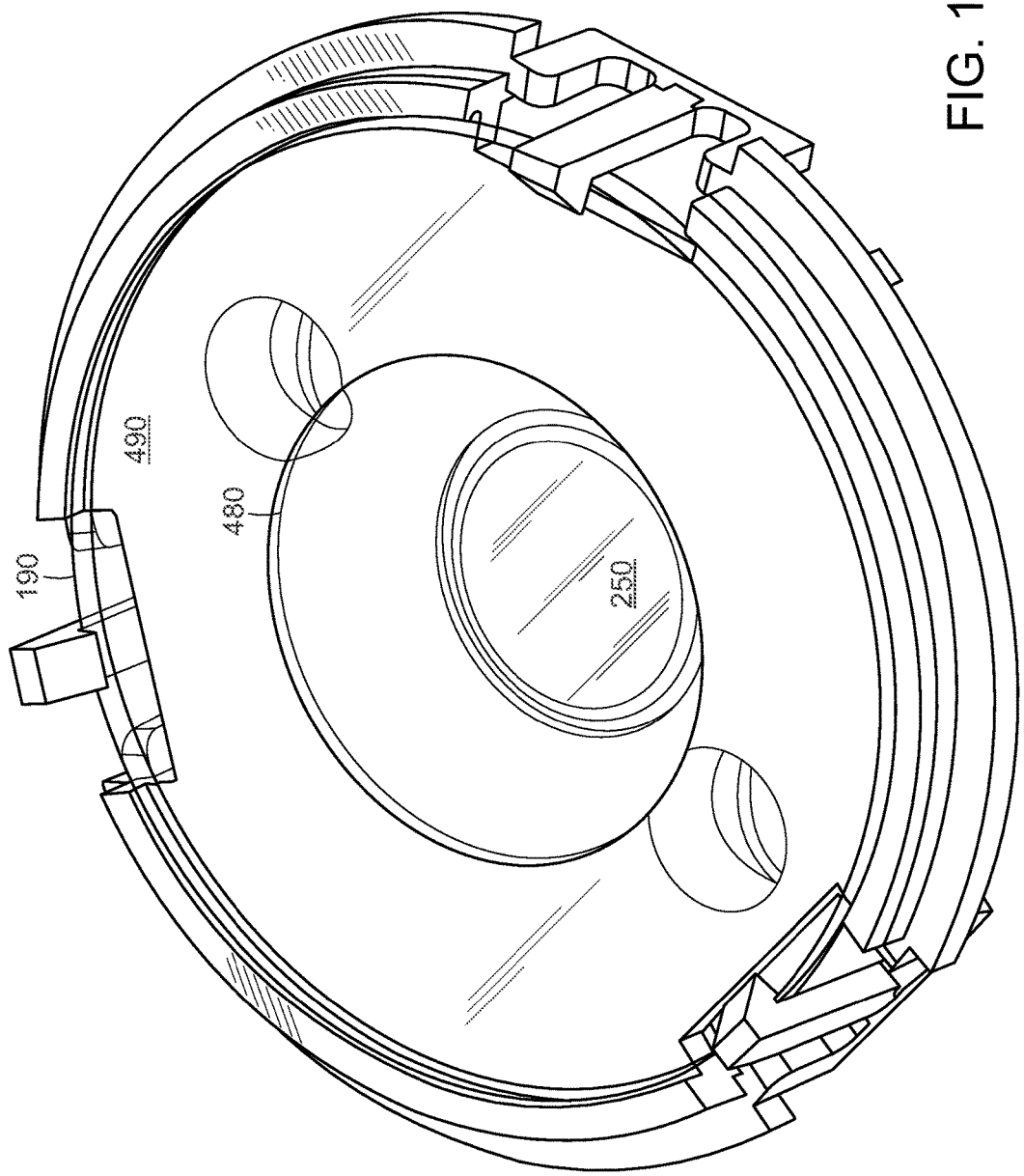
FIG. 10 is a perspective view of a reflecting unit showing a light transmissive substrate having quantum dots on a part of the surface area of the light transmissive substrate corresponding to a circular area above the LED.

FIG. 10 is a perspective view of a light transmissive substrate secured to a reflecting unit similar to that shown in FIG. 6. The light transmissive substrate 190 includes quantum dots dispersed homogenously in a circular area 480 roughly equal to or slightly greater than the area of the light emitting portion 250 of the LED. The remaining portion 490 of the light transmissive substrate 190 lacks quantum dots and can act as a heat sink for the heat energy resulting from emission of light by the quantum dots. Such a light transmissive substrate is referred to as a heat sink light transmissive substrate.

According to this aspect, the active area 480 of the light transmissive substrate where quantum dots are located is less than the total area of the light transmissive substrate. According to this aspect of the disclosure, quantum dots can occupy less than 90%, less than 80%, less than 70%, less than 60%, less than 50%, less than 40%, less than 30%, less than 20%, less than 10% of the surface area of the light transmissive substrate. Because the quantum dots occupy less than the total surface area of the light transmissive substrate 190, the remaining area of the light transmissive substrate 490 that lacks quantum dots can serve as a heat sink to dissipate the heat generated by the quantum dots.

Additional heat sink aspects of the present disclosure include an aluminum holder which holds the light transmissive substrate allowing thermal transfer between the light transmissive substrate and the holder and which reduces the temperature of the quantum light optic. In addition, pressure sensitive adhesives can be used at interfaces to increase the heat sink ability of the quantum light optic by increasing thermal transfer. Further, dichroic films can be used on the light transmissive substrate to allow light to pass through the light transmissive substrate but to reflect heat away from the direction of the emitted light. Still further, vents can be added to the reflecting unit 100 to allow heat to dissipate through the reflective wall. Still further, heat sink material can be combined with various components of the quantum light optic including the reflecting unit, such as by molding, including or combining metal into plastic to result in a composite that promotes the dissipation of heat from the quantum light optic.

Figure 11:
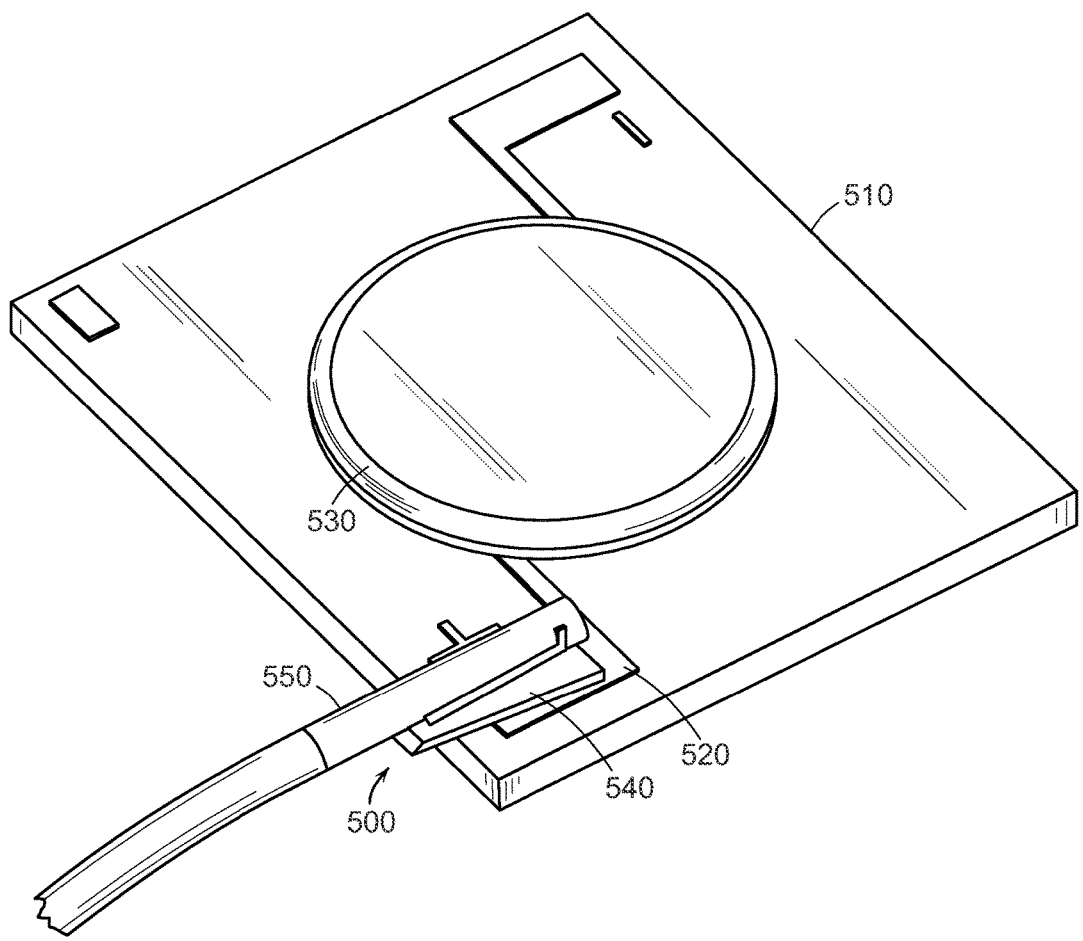
FIG. 11 depicts a particular electrical connector design for electrically connecting a wire to an LED.

FIG. 11 depicts a particular electrical connector design 500 for an LED 510. Electrical pad 520 connects lighting element 530 of the LED 510. Metal clip 540 attached to the LED electrically connects electrical pad 520 and is configured to securely engage a wire 550. The wire 550 is inserted into metal clip 540 which electrically secures the wire 550 in place. According to one embodiment, metal clip 540 may be contained within a sleeve attached to the LED to help guide the wire 550 into the metal clip 540. The sleeve may be transparent to further help guide the wire 550 into the metal clip 540.

The combination of the present disclosure can optionally include filters, films, coatings and other optical elements between the LED and the quantum dots to provide output light of desired characteristics. In addition, the combination can further optionally include filters, films, coatings and other optical elements exterior to the quantum dots and the reflecting unit to still further provide output light of desired characteristics. According to one aspect, a beam shaper such as a total internal reflector is utilized as a secondary optic to collimate the light out of the quantum light optic plane. In addition, diffusers may be added to smooth out the overall beam pattern or improve color spatial uniformity.

Example I

Preparation of Semiconductor Nanocrystals Capable of Emitting 609 nm Light with 3,5-di-tert-butyl-4-hydroxybenzylphosphonic acid Synthesis of CdSe Cores 1.75 mmol cadmium acetate is dissolved in 15.7 mmol of tri-n-octylphosphine at 140° C. in a 20 mL vial and then dried and degassed for one hour. 31.0 mmol of trioctylphosphine oxide and 4 mmol of octadecylphosphonic acid are added to a 3-neck flask and dried and degassed at 110° C. for one hour. After degassing, the Cd solution is added to the oxide/acid flask and the mixture is heated to 270° C. under nitrogen. Once the temperature reaches 270° C., 16 mmol of tri-n-butylphosphine is injected into the flask. The temperature is brought back to 270° C. where 2.3 mL of 1.5 M TBP-Se is then rapidly injected. The reaction mixture is heated at 270° C. for 5 minutes and then the heating mantle is removed from the reaction flask allowing the solution to cool to room temperature. The CdSe cores are precipitated out of the growth solution inside a nitrogen atmosphere glovebox by adding a 3:1 mixture of methanol and isopropanol. The isolated cores are then dissolved in hexane and used to make core-shell materials. (Abs/Emission/FWHM (nm)=557/566/27).

Synthesis of CdSe/CdZnS Core-Shell Nanocrystals

Two identical reactions are set up whereby 25.86 mmol of trioctylphosphine oxide and 2.4 mmol of 3,5-di-tert-butyl-4-hydroxybenzylphosphonic acid (see * below) are loaded into 50 mL four-neck round bottom flasks. The mixtures are then dried and degassed in the reaction vessels by heating to 120° C. for about an hour. The flasks are then cooled to 70° C. and the hexane solution containing isolated CdSe cores from above (0.128 mmol Cd content) are added to the respective reaction mixture. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S is in two-fold excess relative to the Cd and Zn. Two sets of Cd/Zn (0.35 mmol of dimethylcadmium and diethylzinc) and S (1.40 mmol of hexamethyldisilathiane) samples are each dissolved in 4 mL of trioctylphosphine inside a nitrogen atmosphere glove box. Once the precursor solutions are prepared, the reaction flasks are heated to 155° C. under nitrogen. The Cd/Zn and S precursor solutions are added dropwise to the respective reaction flasks over the course of 2 hours at 155° C. using a syringe pump. After the shell growth, the nanocrystals are transferred to a nitrogen atmosphere glovebox and precipitated out of the growth solution by adding a 3:1 mixture of methanol and isopropanol. The isolated core-shell nanocrystals are then dispersed in toluene and the solutions from the two batches are combined and used to make optical materials including same (Abs/Emission/FWHM (nm)=597/609/31).

Preparation of 3,5-Di-tert-butyl-4-hydroxybenzylphosphonic acid 3,5-Di-tert-butyl-4-hydroxybenzylphosphonic acid is obtained from PCI Synthesis, 9 Opportunity Way, Newburyport, Mass. 01950. The preparation of 3,5-Di-tert-butyl-4-hydroxybenzylphosphonic acid generally utilizes the following synthetic approach:

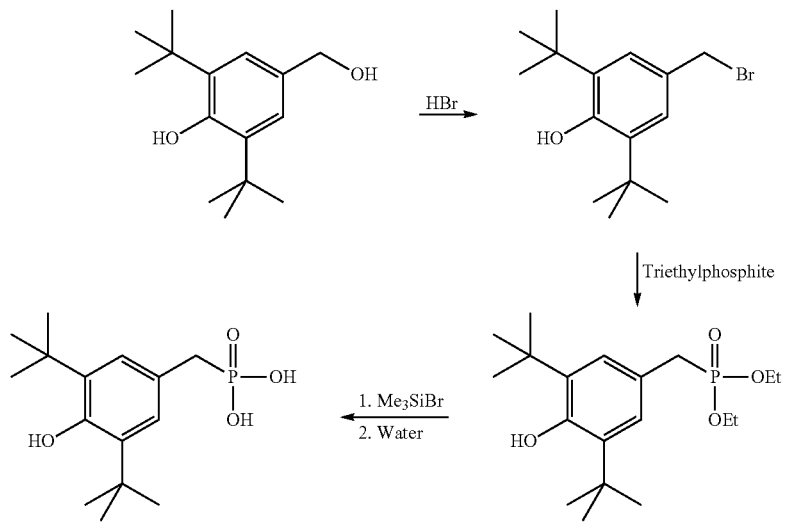

3,5-Di-tert-butyl-4-hydroxybenzylphosphonic acid can be characterized by the following: Melting point: 199-200° C. [Lit: 200° C.; Literature ref: J. D. Spivack, FR1555941 (1969)]; IR: 3614 cm$^{-1}$, 3593 cm$^{-1}$ (weak, O—H stretching); $^1$H-NMR (CD$_3$OD): δ 7.10 (d, aromatic, 2H, J$_{P-H}$=2.6 Hz), 5.01 (s, exchanged HOD), 2.99 (d, —CH$_2$, 2H, J$_{P-H}$=21.2 Hz), 1.41 (s, 18H); $^{13}$C-NMR (CD$_3$OD): δ 152.9 (aromatic), 137.9 (aromatic), 126.2 (aromatic), 123.5 (aromatic), 34.41 (d, —CH$_2$, 35.75, 33.07, J$_{P-C}$=537.2 Hz), 34.35 (—C(CH$_3$)$_3$), 29.7 (—C(CH$_3$)$_3$); $^{31}$P-NMR (CD$_3$OD): δ 26.8.

The above-identified synthetic precursors included in the preparation of 3,5-Di-tert-butyl-4-hydroxybenzylphosphonic acid can be characterized by the following:

Diethyl 3,5-di-tert-butyl-4-hydroxybenzylphosphonate

Melting point: 119-120° C. (Lit: 118-119° C.; Literature ref: R. K. Ismagilov, *Zhur. Obshchei Khimii*, 1991, 61, 387); IR: 3451 cm$^{-1}$ (weak, —OH, stretching), 2953 (weak, —CH$_3$, C—H stretching); $^1$H-NMR (CDCl$_3$): δ 7.066 (d, Ar—H, 2H, J$_{P-H}$=2.8 Hz), 5.145 (s, 1H, —OH), 4.06-3.92 (m, —CH$_2$CH$_3$, 4H, H—H and long-range P—H couplings), 3.057 (d, Ar—CH$_2$, 2H, J$_{P-H}$=21.0 Hz), 1.412 (s, —C(CH$_3$)$_3$, 18H), 1.222 (t, —CH$_2$CH$_3$, 6H); $^{13}$C-NMR (CDCl$_3$): δ 153.98 (aromatic), 136.22 (aromatic), 126.61 (aromatic), 122.07 (aromatic), 62.14 (—OCH$_2$CH$_3$, J$_{P-C}$=24.4 Hz), 33.63 (Ar—CH$_2$, J$_{P-C}$=552.4 Hz), 34.53 [—C(CH$_3$)$_3$], 30.54 [—C(CH$_3$)$_3$], 16.66 (—CH$_2$CH$_3$, J$_{P-C}$=24.4 Hz); $^{31}$P-NMR (CDCl$_3$): δ 28.43.

3,5-di-tert-butyl-4-hydroxybenzyl bromide

Melting point: 51-54° C. (Lit: 52-54° C.; Literature ref: J. D. McClure, *J. Org. Chem.*, 1962, 27, 2365); IR: 3616 cm$^{-1}$ (medium, O—H stretching), 2954 cm$^{-1}$ (weak, alkyl C—H stretching); $^1$H-NMR (CDCl$_3$): δ 7.20 (s, Ar—H, 2H), 5.31 (s, —OH), 4.51 (s, —CH$_2$, 2H), 1.44 {s, [—C(CH$_3$)$_3$], 18H}; $^{13}$C-NMR (CDCl$_3$): δ 154.3 (aromatic), 136.5 (aromatic), 128.7 (aromatic), 126.3 (aromatic), 35.8 [(—C(CH$_3$)$_3$], 34.6 (—CH$_2$), 30.5 [—C(CH$_3$)$_3$].

Other synthetic approaches that are known or readily ascertainable by one of ordinary skill in the relevant art can be used to prepare 3,5-Di-tert-butyl-4-hydroxybenzylphosphonic acid.

Example II

Preparation of Semiconductor Nanocrystals Capable of Emitting Green Light

Synthesis of ZnSe Cores 3.5 mmol diethyl zinc is dissolved in 25 mL of tri-n-octylphosphine and mixed with 5 mL of 1 M TBP-Se. 0.16 mol of Oleylamine is loaded into a 250 mL 3-neck flask, dried and degassed at 90° C. for one hour. After degassing, the flask is heated to 310° C. under nitrogen. Once the temperature reaches 310° C., the Zn solution is injected and the reaction mixture is heated at 270° C. for 15-30 minutes while aliquots of the solution are removed periodically in order to monitor the growth of the nanocrystals. Once the first absorption peak of the nanocrystals reaches 350 nm, the reaction is stopped by dropping the flask temperature to 160° C. and the ZnSe core materials are used without further purification for preparation of CdZnSe cores.

Synthesis of CdZnSe Cores 11.2 mmol dimethylcadmium is dissolved in 40 mL of tri-n-octylphosphine and mixed with 12 mL of 1 M TBP-Se. In a 1 L glass reactor, 0.414 mol of trioctylphosphine oxide and 40 mmol of hexylphosphonic acid are loaded, dried and degassed at 120° C. for one hour. After degassing, the oxide/acid is heated to 160° C. under nitrogen and the entire ZnSe core reaction mixture (see above) is cannula transferred at 160° C. into the 1 L reactor, immediately followed by the addition of Cd/Se solution over the course of 20 minutes via syringe pump. The reaction mixture is then heated at 150° C. for 16-20 hours while aliquots of the solution are removed periodically in order to monitor the growth of the nanocrystals. The reaction is stopped by cooling the mixture to room temperature once the emission peak of the CdZnSe cores reaches 489 nm. The CdZnSe cores are precipitated out of the growth solution inside a nitrogen atmosphere glove box by adding a 2:1 mixture of methanol and n-butanol. The isolated cores are then dissolved in hexane and used to make core-shell materials.

Synthesis of CdZnSe/CdZnS Core-Shell Nanocrystals 0.517 mol of trioctylphosphine oxide and 44.8 mmol of benzylphosphonic acid are loaded into a 1 L glass reactor. The mixture is then dried and degassed in the reactor by heating to 120° C. for about an hour. The reactor is then cooled to 75° C. and the hexane solution containing isolated CdZnSe cores (1.99 mmol Cd content) is added to the reaction mixture. The hexane is removed under reduced pressure. Dimethyl cadmium, diethyl zinc, and hexamethyldisilathiane are used as the Cd, Zn, and S precursors, respectively. The Cd and Zn are mixed in a 3:10 ratio while the S was in two-fold excess relative to the Cd and Zn (combined). The Cd/Zn (6.5/15.2 mmol of dimethylcadmium and diethylzinc) and S (43.4 mmol of hexamethyldisilathiane) samples are each dissolved in 27 mL of trioctylphosphine inside a nitrogen atmosphere glove box. Once the precursor solutions are prepared, the reactor is heated to 150° C. under nitrogen. The precursor solutions are added dropwise over the course of 2 hours at 150° C. using a syringe pump. After the shell growth, the nanocrystals are transferred to a nitrogen atmosphere glovebox and precipitated out of the growth solution by adding a 3:1 mixture of methanol and isopropanol. The isolated core-shell nanocrystals are then dissolved in toluene and used to make quantum dot composite materials.

Example III

Preparation of Optical Component Including Semiconductor Nanocrystals

The following formulation is prepared using optical material including semiconductor nanocrystals (prepared substantially in accordance with the synthesis described in Example I). The semiconductor nanocrystals comprise red-emitting semiconductor nanocrystals dispersed in Toluene and have a spectral component at 609 nm, a FWHM of about 31 nm, a solution quantum yield of 83% and a concentration of 16.4 mg/ml.

3.1 ml of the 16.4 mg/ml suspension of the red-emitting nanocrystals is added to a 20 ml septum capped vial including a magnetic stirrer bar, after the vial is previously closed and purged under vacuum through a syringe needle and then backfilled with nitrogen. Approximately 90 percent of the solvent is removed from the vial by vacuum stripping. 0.504 g of RD-12, a low viscosity reactive diluent commercially available from Radcure Corp., 9 Audrey Pl, Fairfield, N.J. 07004-3401 (also known as Actega Radcure, 5 Mansard Court, Wayne, N.J. 07470) is added through a syringe. Remaining solvent is removed from the vial by vacuum stripping. 2.117 g of DR-150 is then added to the vial through a syringe and the mixture is mixed using a Vortex mixer. (DR-150 is a UV-curable acrylic formulation commercially available from Radcure.). 0.03 gram $TiO_2$ (Ti-Pure R902+ available from DuPont) is next added to the open vial and the mixture is mixed with a Vortex mixer followed by mixing with an homogenizer.

The vial is then capped and deaerated under vacuum and backfilled with nitrogen. The closed vial is then put in an ultrasonic bath for 50 minutes. Care is taken to avoid temperatures over 40° C. while the sample is in the ultrasonic bath. The sample is stored in the dark until used to make a film.

A film is made in the following manner. A previously cleaned (Acetone wipe followed by a Methanol wipe) 1"×3" glass microscope slide is laid-out and four 80 micron plastic shim stock tabs are positioned at the corner of a 1"×1" section on the lower portion of the slide. A small quantity of formulation described above is dispensed in the middle of the 1"×1" area. A second pre-cleaned 1"×3" microscope slide is mated to the first microscope slide and clamped together using with mini-office binders. The clamps are centered over the shim stock.

The microscope slide structure is cured in a 5000-EC UV Light Curing Flood Lamp from DYMAX Corporation with an H-bulb (225 mW/cm$^2$) for 10 seconds. It is turned over to the opposite side and is cured for an additional 10 seconds. The thickness of the nanocrystal containing layer is approximately 80 um. The current example describes the use of 1"×1" glass slide to make a quantum light optic. Glass sheets of different sizes, thickness and shapes (such as circular, rectangle, hexagon etc.) can be used to create a quantum light optic. The shape, size and thickness of the optic will be chosen in conjunction with the holder that secures the optic in the light path.

A quantum light optic is made and tested in the following manner. Four LED (CL-191G. available from Citizen Electronics Co., Ltd.) are attached via silver paint to a circuit board which in turn is mounted to a Thermoelectric cooler (TEC) stage using a layer of silicone heat transfer compound to improve thermal contact. The TEC is set at 25° C. and the LED chips are driven with a constant current source set at 20.0 mA. The above described LED set-up is positioned in front of a 6 inch diameter integration sphere with a 0.5 inch open port. The microscope slide structure containing the 80 micron cured film containing the red semiconductor nanocrystals described above was positioned between the LED set-up and the open port to the integrating sphere, flush against the port. The spectral data is collected with a fiber coupled Avantes spectrophotometer. Results from the spectral analysis are shown in Table 1 and FIG. 12.

TABLE 1

| Sample | CCT | Ra | x | y |
|---|---|---|---|---|
| LED | 6768 | 56.1 | 0.2937 | 0.4094 |
| LED + QD-Containing Film | 2724 | 92 | 0.4615 | 0.4168 |

Figure 12:
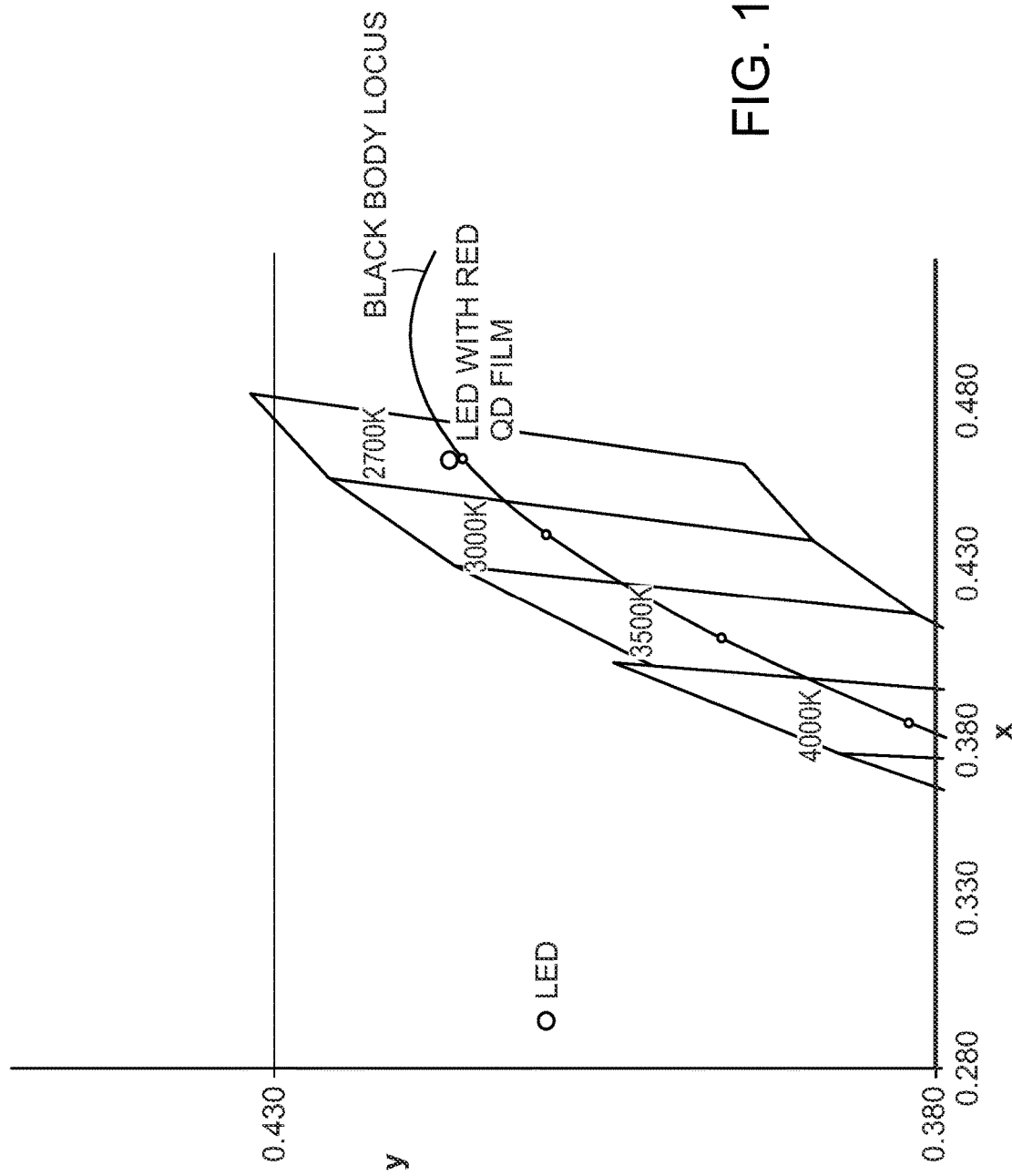
FIG. 12 shows a portion of the 1931 CIE Chromaticity diagram.
Figure 13:
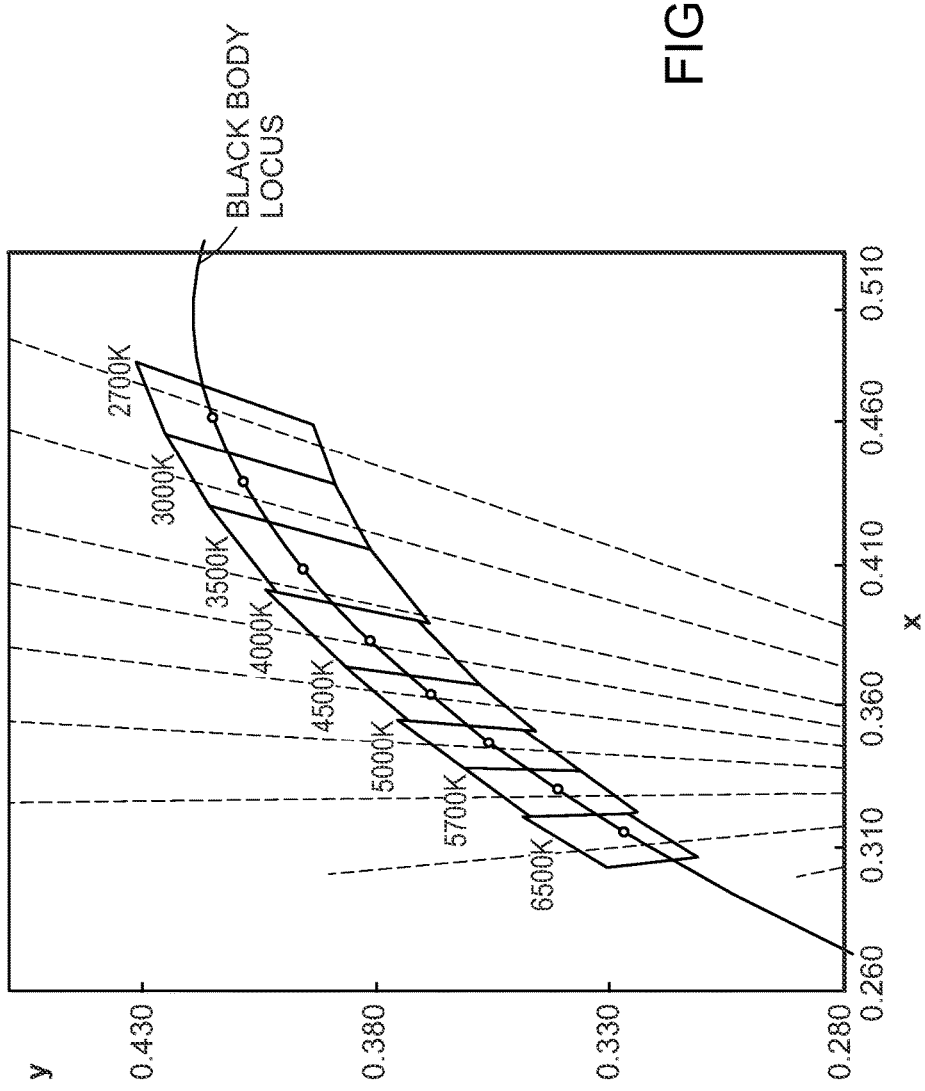
FIG. 13 is a 1931 CIE Chromaticity diagram with ANSI eight nominal CCT (K) tolerance quadrangles.

FIG. 12 shows a portion of the 1931 CIE Chromaticity diagram. Also plotted are the Planckian Locus 1931 (also referred to herein as blackbody radiation curve or blackbody locus), Correlated Color Temperature points marked on the blackbody radiation curve and corresponding surrounding ANSI nominal CCT tolerance quadrangles (or bins). On the Figure is shown an off-white LED, with the x,y co-ordinates 0.2937, 0.4094 as measured in an integrating sphere. When the film described in this Example is placed over the LED, the result is a warm white light with CIE x,y co-ordinates of 0.4615, 0.4168, and a color temperature is 2700K. The resulting light is "white". In certain embodiments, e.g., the Duv or distance from the blackbody curve is less than 0.007. The white light is inside an ANSI bin, and substantially on the blackbody locus. ANSI bins refer to eight nominal CCT tolerance quadrangles surrounding the blackbody locus, shown in FIG. 13, covering cool-to-warm white color space, as outlined in the ANSI C78.377-2008 standard, which is hereby incorporated herein by reference in its entirety.

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An illumination device comprising:
a light source positioned at a distal end of a reflecting unit, the reflecting unit including a reflecting side wall and a reflecting bottom wall; and
an optic including quantum dots forming a layer thereof sandwiched between two heat sink light transmissive substrates, the two heat sink light transmissive substrates and the layer of the quantum dots sandwiched therebetween being disposed completely above an upper edge of the reflecting side wall, such that the optic is separated from the light source by a distance, wherein the upper edge is furthest from the reflecting bottom wall, wherein
the two heat sink light transmissive substrates between which is sandwiched the layer of the quantum dots, are directly connected to each other at opposing ends thereof,
an area of each of the opposing ends at which the two heat sink light transmissive substrates are directly connected to each other is free of the quantum dots and transfers heat away from the quantum dots, and
the area of each of the opposing ends of the two heat sink light transmissive substrates which is free of the quantum dots overlaps and directly contacts the upper edge of the reflecting side wall along a direction extending from the optic toward the reflecting bottom wall, wherein the direction is perpendicular to the reflecting bottom wall.

2. The illumination device of claim 1 wherein an area of the optic including the layer of the quantum dots sandwiched between the two heat sink light transmissive substrates corresponds to a surface area of the light source.

3. The illumination device of claim 2 wherein the quantum dots are confined to an area roughly equal to or slightly larger than the surface area of the light source.

4. The illumination device of claim 1 wherein the optic includes a plurality of areas including the quantum dots sandwiched between the two heat sink light transmissive substrates.

5. The illumination device of claim 1
wherein the light source comprises a plurality of LEDs, and
wherein the optic includes a plurality of areas including quantum dots which correspond to the plurality of LEDs.

6. The illumination device of claim 1 wherein the quantum dots occupy less than 90% of a surface area between the two heat sink light transmissive substrates.

7. The illumination device of claim 1 wherein the quantum dots occupy less than 80% of a surface area between the two heat sink light transmissive substrates.

8. The illumination device of claim 1 wherein the quantum dots occupy less than 70% of a surface area between the two heat sink light transmissive substrates.

9. The illumination device of claim 1 wherein the quantum dots occupy less than 60% of a surface area between the two heat sink light transmissive substrates.

10. The illumination device of claim 1 wherein the quantum dots occupy less than 50% of a surface area between the two heat sink light transmissive substrates.

11. The illumination device of claim 1 wherein a portion of the area of each of the opposing ends of the two heat sink light transmissive substrates lacking the quantum dots is a heat sink.

12. The illumination device of claim 1 wherein the optic includes one or more layers of the quantum dots between the two heat sink light transmissive substrates.

13. The illumination device of claim 12 wherein the optic includes two layers of the quantum dots and a bandpass filter positioned between the two layers of the quantum dots.

14. The illumination device of claim 1 wherein the reflecting unit includes a reflective wall that allows light emitted from the quantum dots to exit the reflecting unit through the reflective wall.

15. The illumination device of claim 14 wherein the reflective wall includes openings to allow light emitted from the quantum dots to exit the reflecting unit through the reflective wall.

16. The illumination device of claim 14 wherein the reflecting unit includes transparent reflective wall portions to allow light emitted from the quantum dots to exit the reflecting unit through the transparent reflective wall portions.

17. The illumination device of claim 1 wherein the reflecting unit includes a heat reflective outer wall.

18. The illumination device of claim 1 electrically connected to a base unit.

19. The illumination device of claim 1 wherein the light source, reflecting unit and the optic are fixedly connected to form a quantum light optic module having a connector for removably and electrically engaging a base unit.

20. The illumination device of claim 1 wherein at least one of the optic and light source is removably attached to the reflecting unit.

21. The illumination device of claim 1 wherein the reflecting unit is removably attached to a base unit.

22. An assembly comprising a plurality of illumination devices with each illumination device comprising
- a light source positioned at a distal end of a reflecting unit;
- the reflecting unit including a reflecting side wall and a reflecting bottom wall; and
- an optic including quantum dots forming a layer thereof sandwiched between two heat sink light transmissive substrates, the two heat sink light transmissive substrates and the layer of the quantum dots sandwiched therebetween being disposed completely above an upper edge of the reflecting side wall, such that the optic is separated from the light source by a distance, wherein the upper edge is furthest from the reflecting bottom wall, wherein
- the two heat sink light transmissive substrates between which is sandwiched the layer of the quantum dots, are directly connected to each other at opposing ends thereof,
- an area of each of the opposing ends at which the two heat sink light transmissive substrates are directly connected to each other is free of the quantum dots and transfers heat away from the quantum dots,
- the area of each of the opposing ends of the two heat sink light transmissive substrates which is free of the quantum dots overlaps and directly contacts the upper edge of the reflecting side wall along a direction extending from the optic toward the reflecting bottom wall, wherein the direction is perpendicular to the reflecting bottom wall, and
- the light source, reflecting unit and the optic are fixedly connected to form a quantum light optic module which is removably and electrically engaged to a base unit.

* * * * *